(12) United States Patent
Inoue

(10) Patent No.: US 8,028,649 B2
(45) Date of Patent: Oct. 4, 2011

(54) LIQUID EJECTION APPARATUS AND RESIST PATTERN FORMING METHOD

(75) Inventor: Seiichi Inoue, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 984 days.

(21) Appl. No.: 11/902,313

(22) Filed: Sep. 20, 2007

(65) Prior Publication Data
US 2008/0158278 A1 Jul. 3, 2008

(30) Foreign Application Priority Data

Sep. 22, 2006 (JP) .................................. 2006-257794

(51) Int. Cl.
*B05B 3/00* (2006.01)
*B05B 7/06* (2006.01)
*B05C 11/00* (2006.01)
*B41J 29/393* (2006.01)

(52) U.S. Cl. ........ 118/313; 118/315; 118/323; 118/679; 118/665

(58) Field of Classification Search .......... 118/313–315, 118/305, 323, 679, 682, 665, 641–643; 347/40, 347/12, 43, 15, 42, 13, 19; 427/117, 118, 427/258, 384, 421.1
See application file for complete search history.

(56) References Cited

U.S. PATENT DOCUMENTS
2005/0156978 A1* 7/2005 Kiguchi et al. ................. 347/14

FOREIGN PATENT DOCUMENTS
JP 9-8436 A 1/1997

* cited by examiner

*Primary Examiner* — Yewebdar T Tadesse
(74) *Attorney, Agent, or Firm* — Birch, Stewart, Kolasch & Birch, LLP

(57) ABSTRACT

The liquid ejection apparatus has: a head having a nozzle group including a plurality of nozzles which are aligned in a first direction and performs ejection of resist liquid onto a wiring substrate; a scanning device which causes the head and the wiring substrate to move relatively in the first direction; an ejection control device which controls the ejection of the resist liquid from the head; and a scanning control device which controls the scanning device in such a manner that the head and the wiring substrate are relatively moved only once in the first direction, through a region of the wiring substrate which corresponds to one relative movement in the first direction of the wiring substrate and the scanning device, wherein the ejection control device controls the ejection of the resist liquid from the head to cause the resist liquid to be ejected onto a same position of the wiring substrate sequentially, at prescribed time intervals, from different nozzles of the nozzle group, to deposit the resist liquid ejected onto the same position of the wiring substrate sequentially from the different nozzles of the nozzle group, in such a manner that a resist pattern having a prescribed thickness and a prescribed pattern is formed on the wiring substrate.

13 Claims, 17 Drawing Sheets

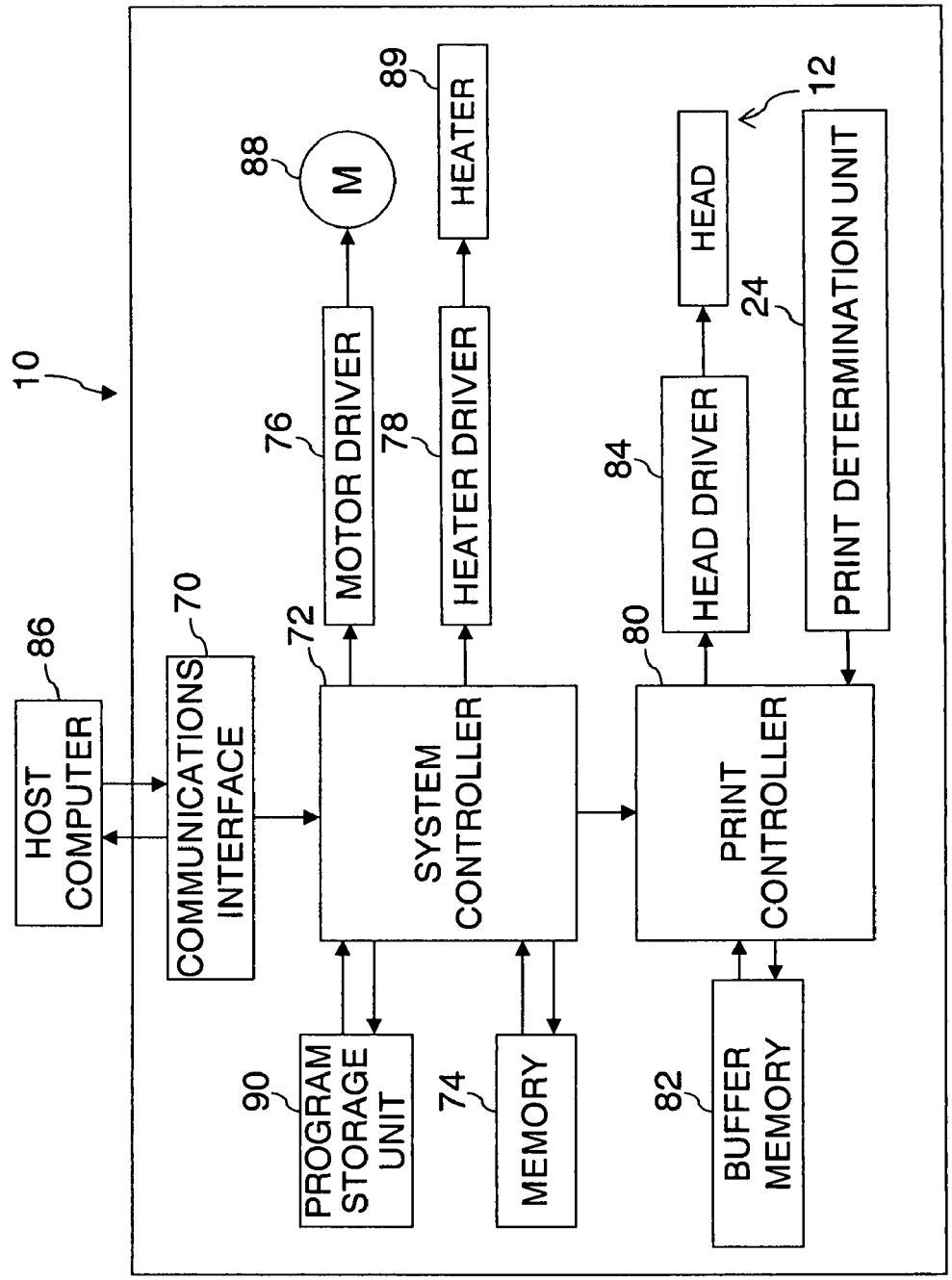

MAIN SCANNING DIRECTION

MAIN SCANNING DIRECTION

LIQUID EJECTION APPARATUS AND RESIST PATTERN FORMING METHOD

BACKGROUND OF THE INVENTION

1. Field of the Invention

The present invention relates to a liquid ejection apparatus and a resist pattern forming method, and more particularly, to resist patterning technology used when forming a wiring pattern on a printed wiring substrate.

2. Description of the Related Art

Photolithography is generally used as a method of manufacturing a print substrate. In photolithography, a resist layer is formed by using dry film resist or liquid resist on copper-clad laminate constituted by an insulating layer and a copper cladding layer made of copper foil, the resist layer is exposed in a pattern by being irradiated with ultraviolet light through a photo mask, and then development is carried out, thereby achieving patterning of a resist pattern. Thereupon, the copper foil which is not covered by the resist is removed by etching, thus obtaining a desired conductor pattern. The foregoing description relates to a subtractive type of photolithography technique, but in semi-additive or additive photolithography techniques, in a similar fashion, a photo resist is patterned in order to serve as a plating mask.

When forming fine circuits by means of subtractive lithography, there is narrowing of the image lines caused by side etching of the metal conductive layer, and the like, and hence this method is not necessarily advantageous for creating fine circuits. An additive method, on the other hand, is beneficial for creating fine circuits, but since all of the metal conductive layers are formed by electroless plating, then the manufacturing costs are high. A semi-additive method involves a large number of steps, but it is excellent for use in manufacturing fine circuits since it enables the use of electroplating, which allows high-speed operation. In the photolithography method described above, the manufacture of the photo mask takes time, and a developing step is required in the resist patterning process, which means that both time and costs become an issue. Furthermore, there is a problem of the disposal of waste solution from the developing step.

In response to this, a method has been proposed in which a pattern of resist material is created directly by means of an inkjet type system. In other words, a desired resist pattern is recorded directly onto a copper-clad laminate comprising an insulation layer and copper foil, using a resist liquid ejected from a liquid-jet head, and a resist layer having the desired pattern is then formed by curing the patterned resist liquid.

Japanese Patent Application Publication No. 9-8436 describes a method of manufacturing a printed circuit board by means of an inkjet type method, in which: the thickness of a resist film is specified; the film thickness is predicted; nozzle control data is created to control the nozzle in such a manner that the film thickness becomes a desired value; and the resist application step is controlled in such a manner that resist is applied separately to each circuit substrate in accordance with the nozzle control data. The operation of predicting the thickness of the resist film comprises the steps of storing data on the relationship between the nozzle shape and the film thickness, calculating the film thickness created by each spraying action for a designated resist pattern shape, from the stored relationship data, and calculating the number of application actions required to form the specified film thickness, from the film thickness per action, in such a manner that the resist film assumes the desired film thickness.

However, the resist layer must have a prescribed thickness, but in a liquid-jet system, it is generally difficult to form a thick film and therefore superimposed deposition (laminated patterning) is required. In a method which acquires a prescribed film thickness by means of superimposed deposition, there is a possibility that processing time is lengthened in accordance with the number of laminating actions and therefore it is difficult to improve the productivity. Furthermore, there are limitations on the superimposition accuracy which can be achieved by mechanical scanning, and there is a possibility that it is difficult to achieve suitable accuracy in the superimposition of the laminated layers.

The invention described in Japanese Patent Application Publication No. 9-8436 makes no concrete disclosure with respect to the control of ink ejection and ink fixing when superimposing resist ink, and since landing interference occurs between mutually adjacent dots and positional divergence occurs when the resist inks are superimposed together, then it does not seem probable that a resist film of high accuracy could be obtained. Furthermore, in the invention described in Japanese Patent Application Publication No. 9-8436, time is required for the processing of each laminating action, and therefore it is difficult to improve the productivity.

SUMMARY OF THE INVENTION

The present invention has been contrived in view of the aforementioned circumstances, an object thereof being to provide a liquid ejection apparatus and a resist pattern forming method whereby a resist pattern having a prescribed film thickness can be formed by accumulating layers of resist liquid.

In order to attain the aforementioned object, the present invention is directed to a liquid ejection apparatus, comprising: a head having a nozzle group including a plurality of nozzles which are aligned in a first direction and performs ejection of resist liquid onto a wiring substrate; a scanning device which causes the head and the wiring substrate to move relatively in the first direction; an ejection control device which controls the ejection of the resist liquid from the head; and a scanning control device which controls the scanning device in such a manner that the head and the wiring substrate are relatively moved only once in the first direction, through a region of the wiring substrate which corresponds to one relative movement in the first direction of the wiring substrate and the scanning device, wherein the ejection control device controls the ejection of the resist liquid from the head to cause the resist liquid to be ejected onto a same position of the wiring substrate sequentially, at prescribed time intervals, from different nozzles of the nozzle group, to deposit the resist liquid ejected onto the same position of the wiring substrate sequentially from the different nozzles of the nozzle group, in such a manner that a resist pattern having a prescribed thickness and a prescribed pattern is formed on the wiring substrate.

According to this aspect of the present invention, since a resist pattern is formed by accumulation in a single-pass scanning method, which causes the head to scan the wiring substrate by moving the head and the wiring substrate relatively just once through the region of the wiring substrate which is scanned by one scan of the wiring substrate by the head in the first direction (in other words, without scanning the same region more than once), then it is possible to form a resist pattern by accumulation of the resist liquid, without any decline in productivity.

In a mode comprising a line type of head including a plurality of nozzle groups, each having two or more nozzles aligned at prescribed intervals in the sub-scanning direction, the nozzle groups being arranged in the main scanning direction at an arrangement pitch corresponding to the dot resolution of the resist pattern, through a length corresponding to the full width of the wiring substrate in the main scanning direction, which is perpendicular to the relative conveyance direction (sub-scanning direction) of the wiring substrate with respect to the head, then it is possible to form a resist pattern over the whole surface of the wiring substrate by means of a single-pass scanning method in which the head is caused to scan the wiring substrate by moving the head and the wiring substrate relatively just once in the sub-scanning direction. In a mode comprising a line type of head, the region of the wiring substrate which can be scanned by one scan of the head and the wiring substrate in the main scanning direction becomes the whole surface of the wiring substrate. In a mode which comprises a line type of head, the first direction is the sub-scanning direction.

Furthermore, in a mode comprising a short head provided with a plurality of nozzle groups, each having two or more nozzles aligned at a prescribed interval in the main scanning direction, the nozzle groups being arranged in the sub-scanning direction at an arrangement pitch corresponding to the image resolution, through a length that is shorter than the full width of the wiring substrate in the main scanning direction, which is perpendicular to the relative conveyance direction (sub-scanning direction) of the wiring substrate with respect to the head, then a resist pattern is formed in the main scanning direction while causing the head to scan the wiring substrate by moving the head and the wiring substrate relatively in the main scanning direction, the wiring substrate and the head are moved relatively through a prescribed distance in the sub-scanning direction by means of a movement device which moves the head and the wiring substrate in the sub-scanning direction, which is perpendicular to the main scanning direction, a resist pattern is formed again in the main scanning direction while scanning the head and the wiring substrate relatively in the main scanning direction, and by repeating this operation, a resist pattern can be formed over the whole surface of the wiring substrate. In the serial method comprising a short head as described above, the first direction is the main scanning direction.

Preferably, the head has the nozzle group including the plurality of nozzles which are aligned in the first direction and of which number is not less than maximum number of the ejection of the resist liquid from the head with respect to the same position of the wiring substrate.

According to this aspect of the invention, since nozzles of a number equal to or greater than the maximum number of accumulated layers of resist liquid are aligned in the first direction, then it is possible to accumulate resist liquid to a required film thickness by means of a single-pass scanning system, without any decline in productivity. The number of nozzles in the first direction may be the same as the maximum number of accumulated layers of resist liquid, but in order to account for error in the ejection volume, a desirable mode is one where the number of nozzles in the first direction is a number exceeding the maximum number of accumulated layers of resist liquid.

Preferably, the head has a plurality of the nozzle groups which are arranged in a second direction which is perpendicular to the first direction, at arrangement intervals which are equal to a minimum interval in the second direction between dots of the resist pattern on the wiring substrate; and a diameter of dot of the resist liquid ejected initially onto the same position of the wiring substrate from each of the plurality of the nozzle groups is less than a distance between centers of dots of the resist liquid which are mutually adjacent in the second direction on the wiring substrate.

In a mode where a plurality of nozzle groups, each comprising a plurality of nozzles aligned in the first direction, are arranged in the second direction, resist liquid is ejected at substantially the same timing from the nozzles which are aligned in the second direction, and the plurality of resist liquids ejected at substantially the same timing arrive at the wiring substrate at substantially the same timing. Therefore, landing interference, such as unification of the liquids, may occur when they come into mutual contact on the wiring substrate.

According to this aspect of the invention, resist liquids which are each ejected initially onto the wiring substrate and are mutually adjacent in the second direction, do not make contact with each other on the wiring substrate, and therefore landing interference such as unification of resist liquid on the wiring substrate does not occur, and positional displacement in the sub-scanning direction of the initial ejection resist liquids is prevented.

For example, if dots of this kind are formed in the first layer of the accumulation of dots, and if the diameter of dots of the $i^{th}$ layer, from the second layer on, is equal to or greater than the distance between the centers of dots which are mutually adjacent in the second direction, then the resist liquid of the first layer which has been ejected initially is prevented from experiencing positional displacement in the second direction, and in the case of the dots in the $i^{th}$ layer, from the second layer on, positional displacement in the second direction is suppressed due to the affinity of these dots with the in the first layer (or the $i-1^{th}$ layer). Consequently, the occurrence of disconnections or bulges in the wiring pattern as a result of faults in the resist pattern is prevented.

In a mode which uses a line type of head, the second direction is the main scanning direction, and in a mode which uses a serial type of head, the second direction is the sub-scanning direction.

Preferably, a diameter of dot of the resist liquid ejected initially onto the same position of the wiring substrate from one of the plurality of the nozzles aligned in the first direction is less than a distance between centers of dots of the resist liquid which are mutually adjacent in the first direction on the wiring substrate.

According to this aspect of the present invention, resist liquids which are initially ejected respectively onto certain positions of the wiring substrate and are mutually adjacent in the first direction, do not make contact with each other on the wiring substrate, and therefore landing interference such as unification of resist liquid on the wiring substrate does not occur, and positional displacement of the initially ejection resist liquid in the first direction is prevented.

For example, if this aspect of the invention is applied to the initially ejected resist liquid (in other words, the resist liquid forming the first layer), of the resist liquids ejected onto the same position of the wiring substrate, then the resist liquid of the first layer is prevented from experiencing positional displacement in the first direction. Even if the diameter of the dots of the second and subsequent layers is equal to or greater than the distance between the centers of dots which are mutually adjacent in the first direction, due to the affinity of these dots with the dots of the first layer, the positional divergence in the first direction is suppressed. Consequently, the occurrence of disconnections or bulges in the wiring pattern as a result of faults in the resist pattern is prevented.

In these aspects of the inventions described above, the diameter of the nozzle which ejects the first resist liquid, of the nozzles aligned in the first direction (in other words, the nozzle which forms the dot of the first layer, for example, the nozzle on the furthest upstream side in terms of the scanning direction in which the head is caused to scan the wiring substrate by moving the head and the wiring substrate relatively with respect to each other), can be less than the diameter of the other nozzles, and this resist liquid of a volume (minimum ejection volume) for forming a dot of minimum diameter is ejected from the nozzle which forms the dot of the first layer.

Preferably, the liquid ejection apparatus further comprises a curing device which cures the resist liquid on the wiring substrate.

According to this aspect of the invention, by curing the resist liquid on the wiring substrate, spreading and wetting of the resist liquid upon deposition or accumulation on the wiring substrate is prevented, and a desirable resist pattern is formed.

The mode of curing the resist liquid on the wiring substrate may be a mode in which the resist liquid is cured to a semi-cured state (high-viscosity state) whereby the resist liquid does not move on the wiring substrate and is prevented from spreading when further resist liquid is layered thereon.

Preferably, the liquid ejection apparatus further comprises an electric field creation device which generates an electric field between the head and the wiring substrate, wherein: the resist liquid contains an insulating solvent, a polymerizable compound, a dispersant and a charge adjusting agent in such a manner that charged particles are dispersed in the insulating solvent; and the electric field creation device applies the electric field to the resist liquid in such a manner that the charged particles are made to adhere to the wiring substrate.

According to this aspect of the invention, by adopting an electrostatic condensation method as the resist liquid ejection method, it is possible to form a resist pattern having high definition and high positional accuracy. Furthermore, bleeding and landing interference is prevented in the resist pattern.

Moreover, in order to attain the aforementioned object, the present invention is also directed to a resist pattern forming method for forming a resist pattern on a wiring substrate by ejecting resist liquid onto the wiring substrate from a head having a plurality of nozzles aligned at prescribed arrangement intervals in a first direction, the resist pattern forming method comprising the step of ejecting the resist liquid sequentially from the plurality of nozzles aligned in the first direction at prescribed time intervals onto a same position of the wiring substrate while causing the head and the wiring substrate to move relatively only once in the first direction through a region of the wiring substrate which corresponds to one relative movement in the first direction of the head and the wiring substrate, in such a manner that the resist liquid ejected from different nozzles of the plurality of nozzles is deposited on the same position of the wiring substrate to form a resist pattern having a prescribed thickness and a prescribed pattern on the wiring substrate.

A desirable mode is one which comprises a curing step for curing the resist liquid to a cured state or a semi-cured state on the wiring substrate, thereby fixing the resist liquid onto the wiring substrate.

According to the present invention, a resist pattern is formed by means of a single-pass scanning method in which a head is caused to scan a wiring substrate by moving the head and the wiring substrate relatively with respect to each other just once through the region of the wiring substrate that can be scanned by means of one scanning of the wiring substrate and the head in the first direction, while ejecting resist liquid sequentially at prescribed time intervals from a plurality of nozzles aligned in a first direction, onto the same position of the wiring substrate, thereby accumulating the resist liquid ejected from the different nozzles, and therefore, it is possible to form a resist pattern by accumulation the resist liquid without any decline in productivity.

BRIEF DESCRIPTION OF THE DRAWINGS

The nature of this invention, as well as other objects and benefits thereof, will be explained in the following with reference to the accompanying drawings, in which like reference characters designate the same or similar parts throughout the figures and wherein:

FIG. 7 is a principal block diagram showing a system configuration of the liquid-jet recording apparatus shown in FIG. 2;

DETAILED DESCRIPTION OF THE PREFERRED EMBODIMENTS

Method of Manufacturing Printed Wiring Substrate

Figure 1A:
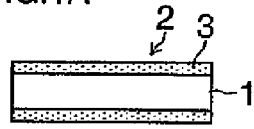
FIGS. 1A to 1R are diagrams showing methods of manufacturing a printed wiring substrate to which embodiments of the present invention are applied.
Figure 1G:
Figure 1L:
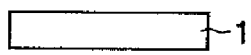
Figure 1B:
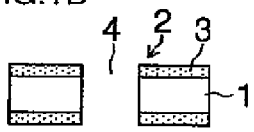
Figure 1H:
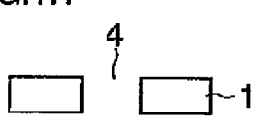
Figure 1M:
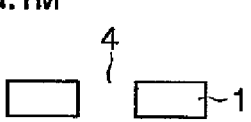
Figure 1C:
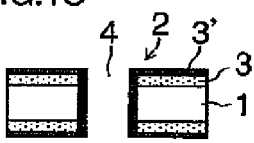
Figure 1I:
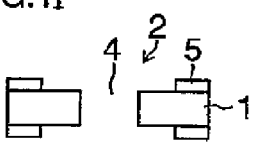
Figure 1N:
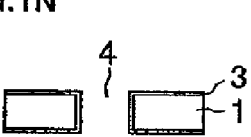
Figure 1D:
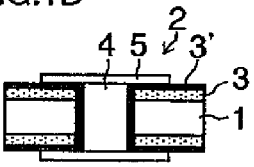
Figure 1J:
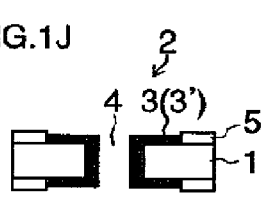
Figure 1O:
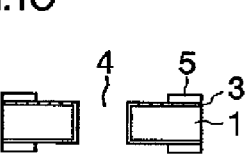
Figure 1E:
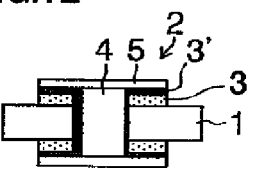
Figure 1K:
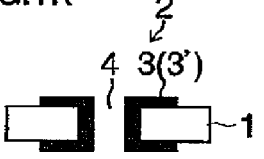
Figure 1P:
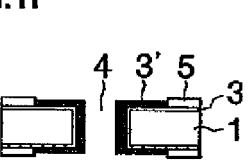

Here, an overview of methods of manufacturing a printed wiring substrate to which embodiments of the present invention can be applied is described below (hereinafter, the printed wiring substrate is also referred to simply as a wiring substrate or a substrate). FIGS. 1A to 1F show the sequence of steps in a method of manufacturing a printed wiring substrate which uses a subtractive method, and FIGS. 1G to 1K and FIGS. 1L to 1R respectively show the sequence of steps in a method of manufacturing a printed wiring substrate 2 by means of an additive method and a method of manufacturing a printed wiring substrate 2 by means of a semi-additive method. FIGS. 1A to 1R show cross-sectional diagrams of a printed wiring substrate.

Firstly, the method of manufacturing a printed wiring substrate by means of a subtractive method is described with reference to FIGS. 1A to 1F. A copper-clad plate 2 comprising an insulation layer 1 and copper foil 3 as shown in FIG. 1A is taken, and after forming through holes 4 which are to be through holes in the copper-clad plate 2, as shown in FIG. 1B, (hole forming step, FIG. 1B), a wiring layer (copper foil layer) 3' is formed on the whole surface thereof by means of electrolytic plating (wiring layer forming step, FIG. 1C).

Thereupon, after forming a resist layer 5 by means of a dry film resist or a liquid resist, ultraviolet light is radiated onto the resist layer 5 via a mask (not illustrated) having a prescribed pattern, thereby exposing a pattern. Then, development is carried out to create a patterned resist layer 5 (resist layer forming step, FIG. 1D).

Figure 1F:
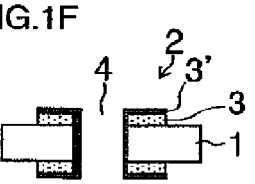

Using the patterned resist layer 5 as a mask, the copper foil 3 and the wiring layer 3' which are not covered with the resist layer 5 are removed by etching (etching step, FIG. 1E), and when the resist layer 5 is then removed (resist removal step), a printed wiring substrate 2 having a prescribed wiring pattern as shown in FIG. 1F is obtained.

FIGS. 1G to 1K show a method of manufacturing a printed wiring substrate 2 by means of an additive technique and FIGS. 1L to 1R show a method of manufacturing a printed wiring substrate 2 by means of a semi-additive technique.

In the additive technique shown in FIGS. 1G to 1K, through holes 4 which are to be through holes are formed in the insulating substrate (insulation layer) 1 shown in FIG. 1G (hole forming step, FIG. 1H), and the resist layer 5 is patterned (resist layer forming step, FIG. 1J). Thereupon, electroless plating is used to pattern the copper foil 3 (3') which is to form the wiring pattern (wiring layer forming step, FIG. 1J) on a section where the resist layer 5 is not formed, the resist layer 5 is peeled away (resist layer removal step), and thereby a wiring substrate 2 formed with the prescribed wiring pattern shown in FIG. 1K is obtained.

In the semi-additive technique shown in FIGS. 1L to 1R, through holes 4 which are to be through holes are formed in the insulating substrate 1 shown in FIG. 1L (hole forming step, FIG. 1M), and copper foil 3 is formed over the whole surface of the insulating substrate 1 by means of electroless plating (underlying plating formation step, FIG. 1N).

Then, a resist layer 5 is patterned on top of the copper foil 3 (resist layer formation step, FIG. 1O), the copper foil 3' which is to be a wiring pattern is patterned by means of electrolytic plating (wiring layer formation step, FIG. 1P), the resist layer 5 is peeled away (resist layer removal step, FIG. 1Q), and the surplus copper foil 3 exposed by peeling away of the resist layer 5 is removed, thereby yielding a printed wiring substrate having a prescribed wiring pattern as shown in FIG. 1R.

First Embodiment

General Composition of Jet Recording Apparatus (Liquid Ejection Apparatus)

Figure 2:
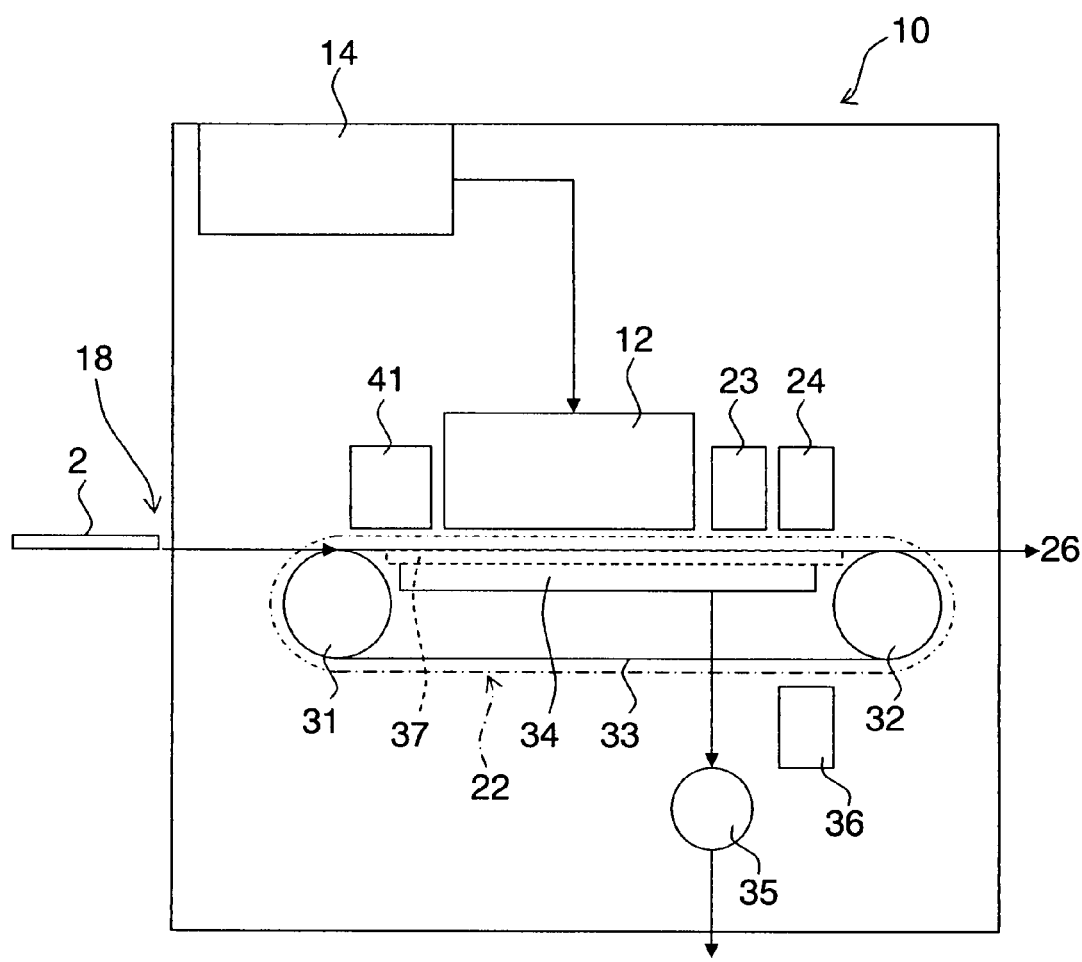
FIG. 2 is a basic schematic drawing of a liquid-jet recording apparatus relating to a first embodiment of the present invention.

FIG. 2 is a diagram of the general composition of an inkjet (liquid jet) recording apparatus (liquid ejection apparatus) relating to an embodiment of the present invention. In the liquid-jet recording apparatus 10 according to the present embodiment of the invention, a resist layer 5 having a prescribed pattern as well as a prescribed thickness can be formed on the substrate 2 formed with a copper foil layer 3 (3') (see FIGS. 1A and 1N) and the insulating substrate 1 (see FIG. 1I), by means of resist liquid.

The liquid-jet recording apparatus 10 shown in FIG. 2 comprises: a head 12 which ejects resist liquid; a resist liquid storing and accumulating unit 14 which stores the resist liquid to be supplied to the head 12; a supply unit 18 which supplies a substrate 2 (which may be a substrate formed with a copper foil layer or an insulating substrate on which a copper foil layer has not been formed); a suction belt conveyance unit 22, disposed facing the nozzle surface (ejection surface) of the head 12, which holds and conveys a substrate 2 to an ejection region below the head 12; a curing process unit 23 which heats and cures (raises the viscosity of) a resist layer 5 formed by using the resist liquid from the head 12; an ejection determination unit 24 which reads out the pattern of the resist layer 5 (namely, the dots constituting the resist layer 5); and an output unit 26 which outputs a substrate 2 formed with the resist layer 5, to the exterior, and sends same to the subsequent process.

Figure 1Q:
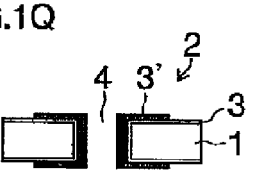
Figure 1R:
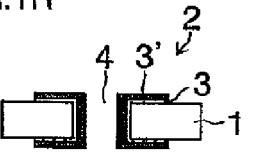

Functions required of the resist liquid used in the present embodiment include durability with respect to the electroplating solution used when forming the wiring substrate 3' shown in FIG. 1D and FIG. 1P (including a resin which is insoluble in the electroplating solution), and detachability in the resist layer removal step shown in FIGS. 1F, 1K and 1Q (solubility in the resist layer removal liquid). The resist liquid does not need to contain the photosensitive material that is included in the resist liquid generally used in a photolithography method, or the like. In other words, since the method of manufacturing a printed wiring substrate according to the present embodiment does not include a step of exposing the resist layer 5, then it is possible to use a so-called resin liquid, which contains resin material, as the resist liquid of the present embodiment. Needless to say, when a subtractive technique is adopted, the resist liquid used in the patterning of a resist layer must have functions including durability with respect to the etching solution, and detachability.

Furthermore, the resist liquid used in the present embodiment has a curing function in accordance with the composition of the curing process unit 23. The present embodiment describes a resist liquid having a thermal curing function whereby the liquid is cured by heating.

Moreover, for the substrate 2 according to the present embodiment, it is possible to use a cladding lamination plate in which copper foil layers 3 are respectively formed on the front surface and the rear surface of an insulation layer 1 made of glass epoxy, paper epoxy, or the like, or to use a flexible substrate in which conducting layers of gold or copper (copper foil layer 3) are respectively formed on the front surface and the rear surface of an insulation layer 1 made of a resin material.

In the case of a configuration in which a plurality of types of substrate can be used, it is preferable that an information recording medium such as a bar code and a wireless tag containing information about the type of substrate is attached to the magazine, and by reading the information contained in the information recording medium with a predetermined reading device, the type of substrate to be used is automatically determined, and ejection is controlled so that the resist liquid is ejected in an appropriate manner in accordance with the type of substrate. A composition may be adopted in which the substrate information can be input by the user by means of a user interface.

The substrate 2 supplied from the supply unit 18 is sent to the suction belt conveyance unit 22. The suction belt conveyance unit 22 has a configuration in which an endless belt 33 is set around rollers 31 and 32 so that the portion of the endless belt 33 facing at least the nozzle face of the head 12 and the sensor face of the ejection determination unit 24 forms a plane (a flat surface).

The belt 33 has a width that is greater than the width of the substrate 2, and a plurality of suction restrictors (not shown) are formed on the belt surface. A suction chamber 34 is disposed in a position facing the sensor surface of the ejection determination unit 24 and the nozzle surface of the head 12 on the interior side of the belt 33, which is set around the rollers 31 and 32, as shown in FIG. 2; and a negative pressure is generated by sucking air from the suction chamber 34 by means of a fan 35, thereby the substrate 2 is held on the belt 33 by suction. In other words, the region of the belt 33 where the suction apertures are formed functions as a region for holding the substrate 2. The mode of holding the substrate 2 on the belt 33 is not limited to an air suction method, and it is also possible to adopt other methods, as appropriate, such as electrostatic attraction.

The belt 33 is driven in the clockwise direction in FIG. 2 by the motive force of a motor (not shown in FIG. 2, but shown as a reference numeral 88 in FIG. 7) being transmitted to at least one of the rollers 31 and 32, which the belt 33 is set around, and the substrate 2 held on the belt 33 is conveyed from left to right in FIG. 2.

A belt cleaning unit 36 which removes resist liquid adhering to the belt 33 is provided at a prescribed position outside the belt 33 (a suitable position outside the print region). Although the details of the configuration of the belt-cleaning unit 36 are not shown, examples thereof include a configuration in which the belt 33 is nipped with a brush roller or a water absorbent roller, an air blow configuration in which clean air is blown onto the belt 33, and a combination of these. In the case of the configuration in which the belt 33 is nipped with the cleaning roller, it is preferable to make the linear velocity of the cleaning roller different to that of the belt 33, in order to improve the cleaning effect.

A supply side sensor (not shown) which determines the presence or absence of the substrate 2 (for example, which judges whether or not the leading end of the substrate 2 has arrived at the suction belt conveyance unit 22) is provided at the furthest upstream position on the conveyance path formed by the suction belt conveyance unit 22. The supply side sensor is composed by a light source (such as an LED) and a photoreceptor which are disposed on opposite sides of the substrate 2, and it outputs a determination signal which is directly proportional to the amount of light arriving at the photoreceptor. If a substrate 2 is present between the light source and the photoreceptor, then the amount of light incident on the photoreceptor is reduced in comparison with a case where the substrate 2 is not present therebetween, and therefore the presence or absence of a substrate 2 can be judged on the basis of the amount of light incident on the photoreceptor (in other words, the magnitude of the determination signal). It is also possible to dispose a light source and a photoreceptor on the same side of the substrate 2 in such a manner that light emitted by the light source and reflected by the substrate 2 is received by the photoreceptor.

A heating fan 41 is provided at the next stage after the supply side sensor (the downstream side in terms of the substrate conveyance direction). The heating fan 41 has the function of a so-called pre-heating device for the substrate 2, since it heats the substrate 2 by blowing heated air onto the substrate 2 before forming the resist layer 5. Heating (preheating) the substrate 2 before forming the resist layer 5 in this way has beneficial effects of stabilizing the deposition of resist liquid on the substrate 2, as well as promoting the curing of the resist liquid after deposition of the resist liquid. Instead of the heating fan 41 and the curing process unit 23, it is also possible to adopt a mode in which a heater 37 (see broken line) is provided for the head 12, to the inner side of the belt 33.

In a mode where the heater 37 is provided inside the belt 33, it is possible to control the temperature of the substrate 2 to a prescribed temperature while the substrate 2 is being held on the belt 33, thereby helping to promote the curing of the resist liquid deposited on the substrate 2.

In the example of the positioning of the heater 37 shown in FIG. 2, the heater 37 is disposed so as to correspond to the full width of the region where the substrate 2 is held on the belt 33, as well as being disposed in a region extending in the substrate conveyance direction from the resist liquid ejection start position of the head 12, until the ejection determination unit 24 (in other words, so as to correspond to the steps from pre-heating until fixing of the resist layer 5 onto the substrate 2).

Figure 3:
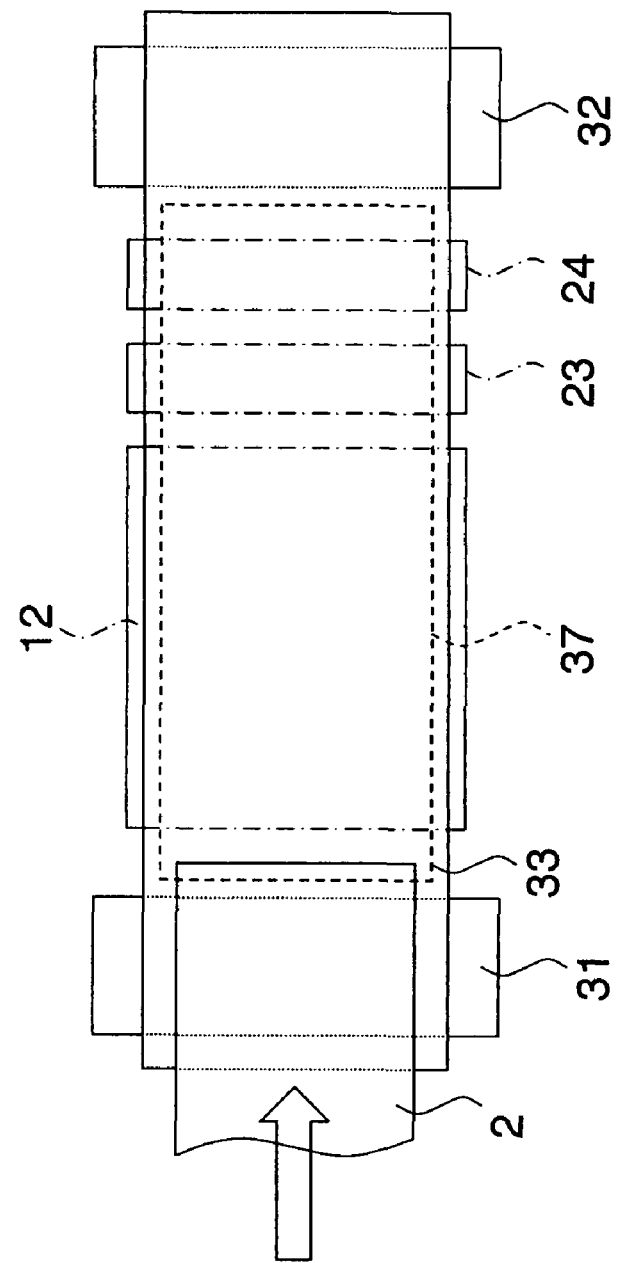
FIG. 3 is a plan view of the principal part of the peripheral printing region of the liquid-jet recording apparatus illustrated in FIG. 2.

The head 12 provided at the next stage after the heating fan 41 (the downstream side in terms of the substrate conveyance direction) is a so-called "full line head" in which a line head having a length corresponding to the maximum substrate width is arranged in a direction (the sub-scanning direction in the present embodiment) which is perpendicular to the substrate conveyance direction (the main scanning direction in the present embodiment) (see FIG. 3).

Although an example of the detailed structure is described later, the head 12 is constituted by a line head in which a plurality of ejection ports (nozzles) are arranged along a length that exceeds at least one side of the maximum-size substrate 2 intended for use in the liquid-jet recording apparatus 10, as shown in FIG. 2.

In this way, by using a full line type of recording head 12 which covers the whole width of the substrate 2, a resist layer 5 having a prescribed pattern is formed on the whole surface of the substrate 2 by means of a single-pass scan in which an operation of moving the substrate 2 and the head 12 relatively with respect to each other in the main scanning direction is carried out once.

An output side sensor (not shown) which determines the presence or absence of a substrate 2 (by judging whether or not the trailing end portion of the substrate 2 has exited from the suction belt conveyance unit 22) is provided on the downstream side of the ejection determination unit 24 (in other words, on the downstream side of the conveyance belt suction unit 22 in terms of the substrate conveyance direction). The output sensor side sensor adopts the same composition as that of the supply side sensor described above.

In this way, a substrate 2 formed with a resist layer 5 is output from the output unit 26. Furthermore, although not shown in FIG. 2, a sorter which collects substrates 2 according to type (for example, by size, resist pattern, or the like) is provided in the output unit 26.

As shown in FIG. 2, the resist liquid storing and loading unit 14 has a tank which stores resist liquid to be supplied to the head 12, and this tank is connected to the head 12 via a channel (not shown). Furthermore, the resist liquid storing and loading unit 14 has a warning device (display device, alarm sound generating device) for issuing a warning when the remaining amount of resist liquid has become low.

The curing process unit 23 provided on the downstream side of the head 12 cures the resist layer 5 formed on the substrate 2 by heating the resist layer 5, thereby fixing the resist layer 5 on the substrate 2. The heating device for heating the resist layer 5 may adopt a mode which blows air heated by a heater or a mode which involves heating based on infrared or laser energy.

The ejection determination unit 24 according to the present embodiment functions as an ejection determination device which determines the print state (loss of pattern, etc.) by reading in the pattern of the resist layer 5 formed on the substrate 2 and carrying out prescribed signal processing, and the like, and provides it to the control system (for example, the ejection control unit 80 in FIG. 7). The ejection determination unit 24 according to the present embodiment is constituted by a line sensor having a row of photoreceptor elements of a greater width than the total width of the belt 33 (the length in the sub-scanning direction, which is perpendicular to the substrate conveyance direction) (see FIG. 3). Instead of a line sensor, it is also possible to use an area sensor composed of photoelectric transducing elements which are arranged two-dimensionally.

Description of Structure of Head

Figure 4A:
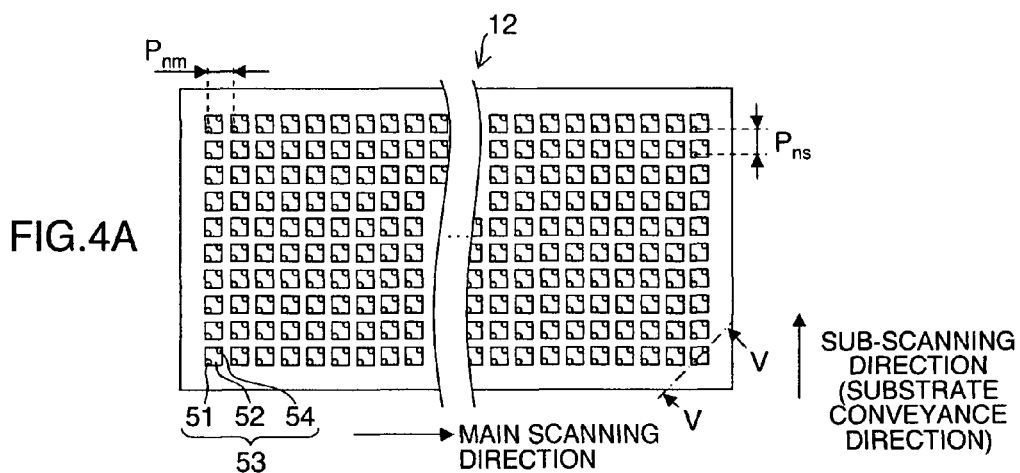
FIGS. 4A to 4D are plan view perspective diagrams showing examples of the composition of a print head.
Figure 4B:
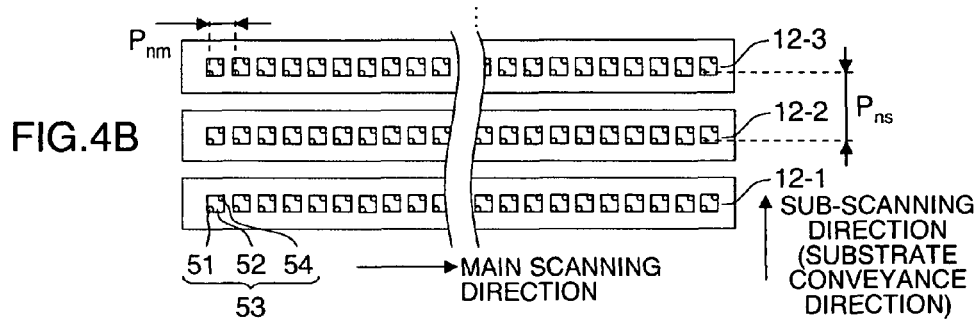
Figure 4C:
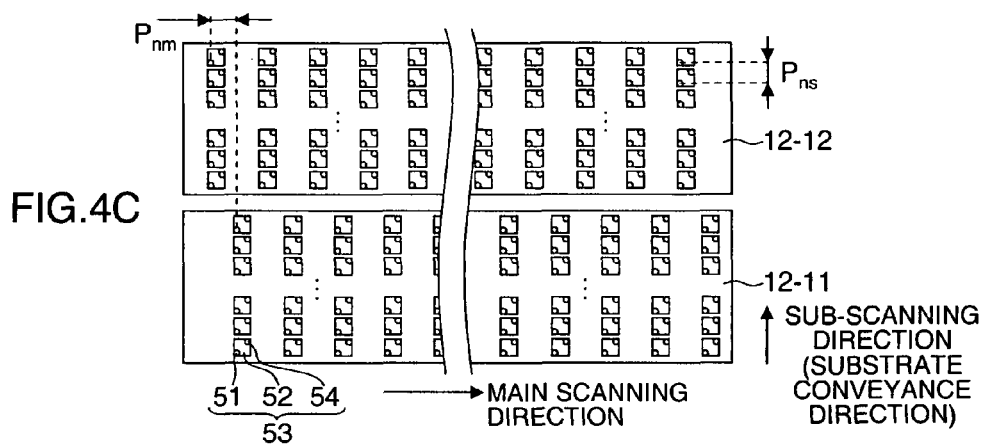
Figure 4D:
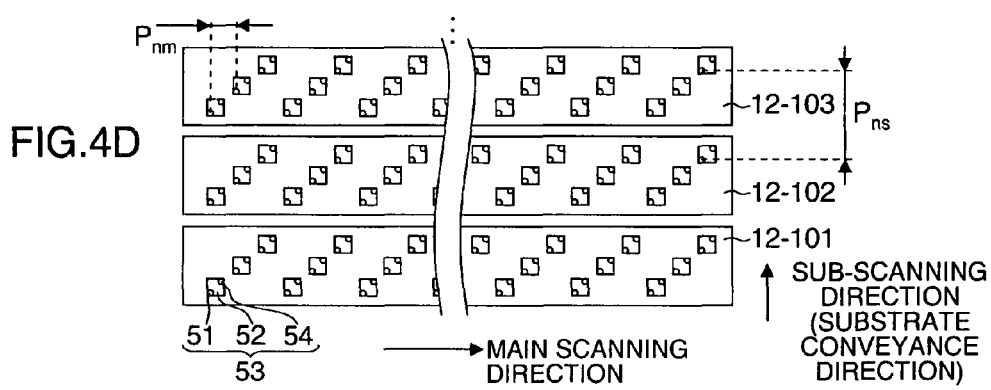

Next, the structure of a head is described below. FIG. 4A is a plan view perspective diagram showing an example of the structure of the head 12, and FIGS. 4B to 4D are plan view perspective diagrams showing further examples of the structure of the head 12 (examples where the head 12 is divided into a plurality of head blocks (nozzle blocks)). As shown in FIGS. 4A to 4D, the head 12 according to the present embodiment comprises ten ejection element rows in which a plurality of ejection elements 53 each comprising a nozzle 51 from which resist liquid is ejected and a pressure chamber 52 corresponding to the nozzle 51, and the like, are arranged through a length corresponding to the full width of the substrate 2 following the main scanning direction (second direction), the ten ejection element rows being arranged equidistantly in the sub-scanning direction (first direction) which is the direction of relative conveyance of the head 12 and the substrate 2.

In other words, the head 12 has a structure in which there are ten nozzles 51 capable of ejecting resist liquid onto the same position on the substrate 2 (see FIG. 3), and therefore in a single-pass scanning method, it is able to eject one to ten droplets of resist liquid in a superimposed fashion on the same position on the substrate 2.

In general, the resist layer of the wiring substrate is required to have a thickness of approximately 1 μm to 30 μm. On the other hand, the thickness of the resist liquid (resist layer 5) obtained by one ejecting action in a liquid-jet method is approximately 0.1 μm to 1 μm, and therefore in order to obtain a film thickness of approximately 1 μm to 30 μm using a liquid-jet method, it is necessary to deposit the resist liquid in a superimposed fashion on the same position, a plurality of times, so as to accumulate layers of superimposed resist liquid.

The liquid-jet recording apparatus 10 shown in the present embodiment forms a resist layer 5 having a prescribed thickness by accumulating layers of resist liquid by depositing resist liquid in a superimposed fashion on the same position on the substrate 2, from a plurality of different nozzles belonging to the same nozzle group which is constituted by a plurality of nozzles aligned in the sub-scanning direction.

For example, if a resist layer 5 having a film thickness of 1 μm is formed in one ink ejection action, then in order to form a 10 μm-thick resist layer 5, resist liquid is ejected from all ten of the nozzles disposed at prescribed intervals in the sub-scanning direction, in such a manner that ten droplets of resist liquid are deposited onto the same position on the substrate 2. The arrangement pitch of the nozzles in the sub-scanning direction may be an equidistant pitch (arrangement pitch: $P_{ns}$) or it may be altered appropriately for each nozzle.

When a subsequent resist liquid lands after the previously deposited resist liquid has acquired a cured state (or a semi-cured state where it has not cured completely, but where the two of the resist liquid do not spread over the substrate even when the subsequent resist liquid lands on the previously deposited resist liquid), then the two resist liquid droplets are superimposed together without spreading. Consequently, the arrangement interval $P_{ns}$ between adjacent nozzles in the sub-scanning direction, the conveyance speed of the substrate 2, and the ejection timings are decided in such a manner that a subsequent droplet of resist liquid lands after the previously deposited resist liquid has acquired a cured state (or a semi-cured sate).

In other words, if the arrangement pitch of the nozzles in the sub-scanning direction is an equidistant interval ($P_{ns}$), then by ejecting resist liquid at a uniform ejection cycle, in sequence (sequentially from the nozzles on the upstream side in the substrate conveyance direction), from the nozzles aligned in the sub-scanning direction, while conveying the substrate 2 at a uniform conveyance speed, a plurality of droplets of resist liquid are deposited sequentially onto the same position at the substrate 2, at uniform time intervals apart, and these droplets of resist liquid are superimposed on each other in layers.

The thickness of the resist layer 5 can be controlled by altering the number of layers of resist liquid (in other words, the number of nozzles which perform ejection). More specifically, by ejecting resist liquid of 1 μm thick from five nozzles, for example, by using every other nozzle of the ten nozzles aligned in the sub-scanning direction, then it is possible to obtain a resist layer 5 having a thickness of 5 μm. In the alternate driving sequence described above, either the conveyance speed of the substrate 2 is doubled while maintaining the same ejection cycle as that used when ejecting resist liquid from all ten nozzles, or alternatively, the ejection cycle is doubled while maintaining the same conveyance speed. Of course, it is also possible to select five consecutive nozzles of the ten nozzles and eject resist liquid from these five nozzles without changing the ejection cycle or the conveyance speed.

The present embodiment is described above with reference to a mode in which ten nozzles are arranged in the sub-scanning direction, but it is also possible to arrange a greater number of nozzles in the sub-scanning direction. The number of nozzles arranged in the sub-scanning direction is decided on the basis of the maximum number of layers of resist liquid that are to be accumulated, and this is determined by (maximum thickness of resist layer 5)/(thickness of resist liquid created by one ejection action). In other words, supposing that a resist layer 5 of 30 μm thickness is to be formed, then taking account of the error per layer of resist, a more desirable mode is one in which the number of nozzles in the sub-scanning direction is equal to or greater than 30 (and desirably, the number exceeding 30 nozzles). Furthermore, it is also desirable to adopt a composition where a redundant nozzle is provided in terms of the sub-scanning direction, in such a manner that if a defective nozzle is found, then the redundant nozzle can perform ejection in place of the defective nozzle.

In this way, if resist liquid ejected from different nozzles aligned in the sub-scanning direction is accumulated in layers by using a single-pass scanning method employing a full line type of head 12 and thereby the resist layer 5 is formed, then the superimposition accuracy in the main scanning direction of the resist liquid ejected from the plurality of nozzles aligned in the sub-scanning direction is influenced by the scanning (movement) accuracy during the single-pass scanning and the positional accuracy in the main scanning direction of the nozzles aligned in the sub-scanning direction, and therefore it is possible to reduce displacement of the resist liquid deposition positions in the main scanning direction.

In general, if the distance of the relative scanning (the total scanning distance; the total movement distance) of the substrate 2 and the head 12 is long, then there is a tendency for the deposition accuracy to decline relatively. For example, in the related art technology in which resist liquid is deposited in a superimposed fashion on a substrate by using a multi-scanning method in which a head having only one nozzle in terms of the sub-scanning direction is scanned (moved) back and forth reciprocally a plurality of times with respect to the substrate, then the "total scanning distance"=(scanning distance in one scan)×(number of depositions). In the present embodiment, a plurality of nozzles corresponding to the number of superimposed depositions are provided in the sub-scanning direction, and resist liquid is deposited in a superimposed fashion on the substrate by means of a single-pass scanning method. Therefore, in the present embodiment, the total scanning distance is equal to the scanning distance covered in one scanning action, and therefore the scanning accuracy (the scanning accuracy within the single-pass scan) is improved in comparison with a conventional multi-pass scanning method.

Furthermore, in the present embodiment, the total scanning distance of the substrate 2 and the head 12 is shorter than in the related art, as described above, and therefore the movement time of the substrate 2 and the head 12 is also shorter than in the related art. By shortening the processing time in this way, it is possible to suppress positional displacement caused by expansion or contraction of the substrate 2, in comparison with the related art, and therefore it is possible to reduce decline in accuracy caused by expansion or contraction of the substrate 2.

Furthermore, as shown in FIG. 4B, a mode is also possible in which a prescribed number of head blocks 12-1, 12-2, . . . , (in the present example, ten head blocks) are arranged at a prescribed arrangement pitch in the sub-scanning direction (where the arrangement pitch between the head blocks becomes the arrangement pitch $P_{ns}$ between the nozzles in the sub-scanning direction), each head block having one ejection element row in which a plurality of ejection elements 53 are aligned at an arrangement pitch of $P_{nm}$ through a length corresponding to the full width of the substrate 2 in the main scanning direction. FIG. 4B shows just three of the ten head blocks. In other words, the compositional example of the head shown in FIG. 4B represents a composition in which ten or more head blocks which eject the same resist liquid are arranged in the sub-scanning direction. In the mode shown in FIG. 4B, desirably, the curing process unit 23 shown in FIG. 2 is provided between the head blocks. Moreover, as shown in FIG. 4C, it is also possible to adopt a mode in which two head blocks 12-11 and 12-12 are provided, the head blocks comprising a plurality of nozzle groups each having a number of nozzles corresponding to the number of superimposed depositions of resist liquid aligned in the sub-scanning direction, and the nozzle groups being arranged at a pitch of $P_{nm}$ in the main scanning direction, wherein the nozzle groups of one head block 12-12 are respectively disposed in the central positions of the arrangement pitch between the nozzles groups of the other head block 12-11, in the main scanning direction; and as shown in FIG. 4D, it is also possible to adopt a mode in which ten head blocks 12-101, 12-102, . . . , 12-110 are provided, a matrix arrangement being adopted whereby, instead of the nozzle arrangement of the head blocks 12-1, 12-2, . . . shown in FIG. 4B, a plurality of nozzle groups are arranged in the sub-scanning direction in such a manner that a number of nozzles corresponding to the number of superimposed layers of resist liquid are aligned in an oblique direction which is not perpendicular to the sub-scanning direction.

In the mode shown in FIG. 4D, the arrangement pitch of the nozzles in the main scanning direction is the arrangement pitch $P_{nm}$ of the projected nozzle row obtained if the nozzles of each of the head blocks are projected to an alignment in the main scanning direction. Furthermore, the arrangement pitch $P_{ns}$ of the nozzles in the sub-scanning direction is equal to the arrangement pitch of each of the head blocks.

The pressure chambers 52 provided to correspond to the nozzles 51 of the head 12 and the head blocks 12-1 to 12-10, the head blocks 12-11 and 12-12 and the head blocks 12-101 and 12-102 (to 12-110) shown in FIGS. 4A to 4D have a substantially square planar shape, a nozzle 51 and a supply port 54 being provided at respective corners on a diagonal of this planar shape. Moreover, the pressure chambers 52 are each connected via a supply port 54 to the common liquid chamber (indicated by reference numeral 55 in FIG. 5).

Figure 5:
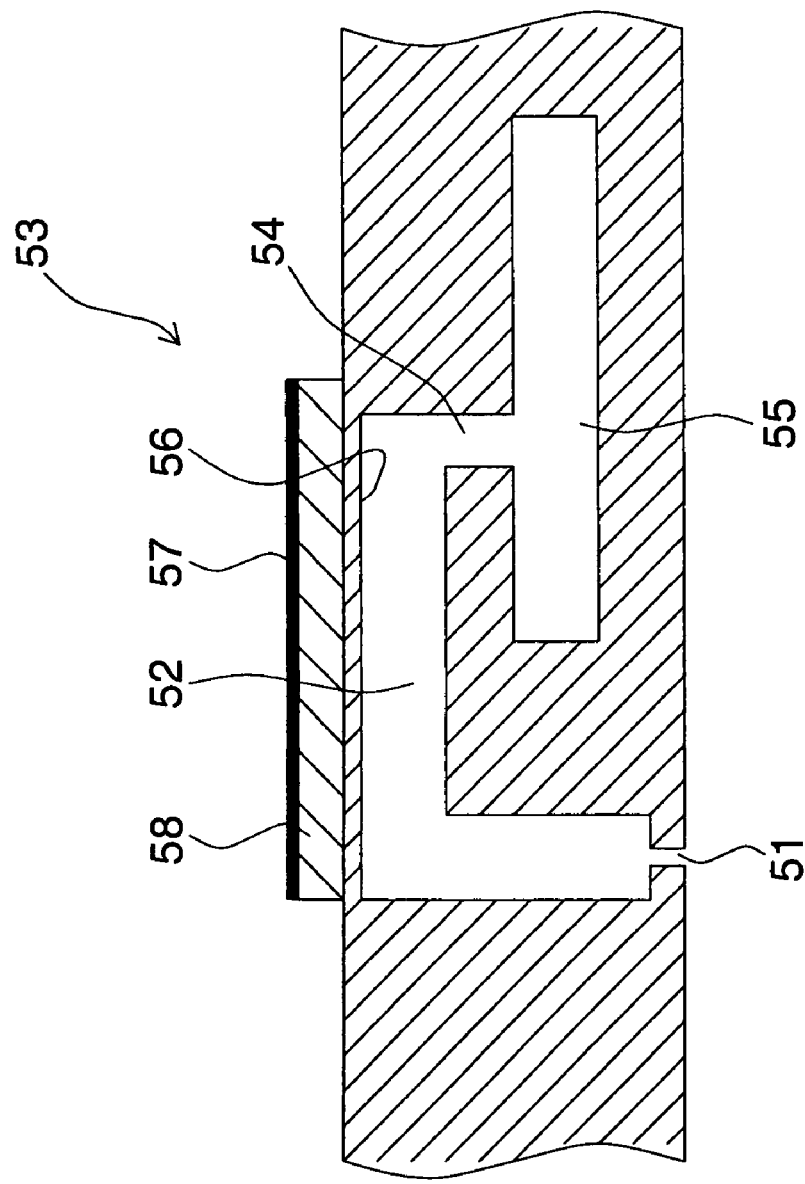
FIG. 5 is a cross-sectional diagram showing the structure of a head.

FIG. 5 is a cross-sectional diagram showing the structure of the head 12 (an ejection element 53 shown in FIGS. 4A to 4D) (namely, a cross-sectional diagram along line V-V in FIG. 4A). An individual electrode 57 is bonded, via a piezoelectric element 58, to the diaphragm 56 which constitutes the ceiling of the pressure chambers 52, and the diaphragm 56 also functions as a common electrode for the piezoelectric elements 58. By applying a drive voltage to the individual electrode 57, a bending deformation is applied to the piezoelectric element 58, the pressure chamber 52 is deformed, and resist liquid is thereby ejected from the nozzle 51. When resist liquid has been ejected from the nozzle, new resist liquid is supplied to the pressure chamber 52 from the common liquid chamber 55, via the supply port 54.

In the present embodiment, a method is adopted in which resist liquid is pressurized by means of the deformation of a piezoelectric element 58, which is typically a piezo element. In implementing the present embodiment, another actuator apart from a piezo element can also be used as the piezoelectric element 58.

Description of Resist Liquid Supply System

Figure 6:
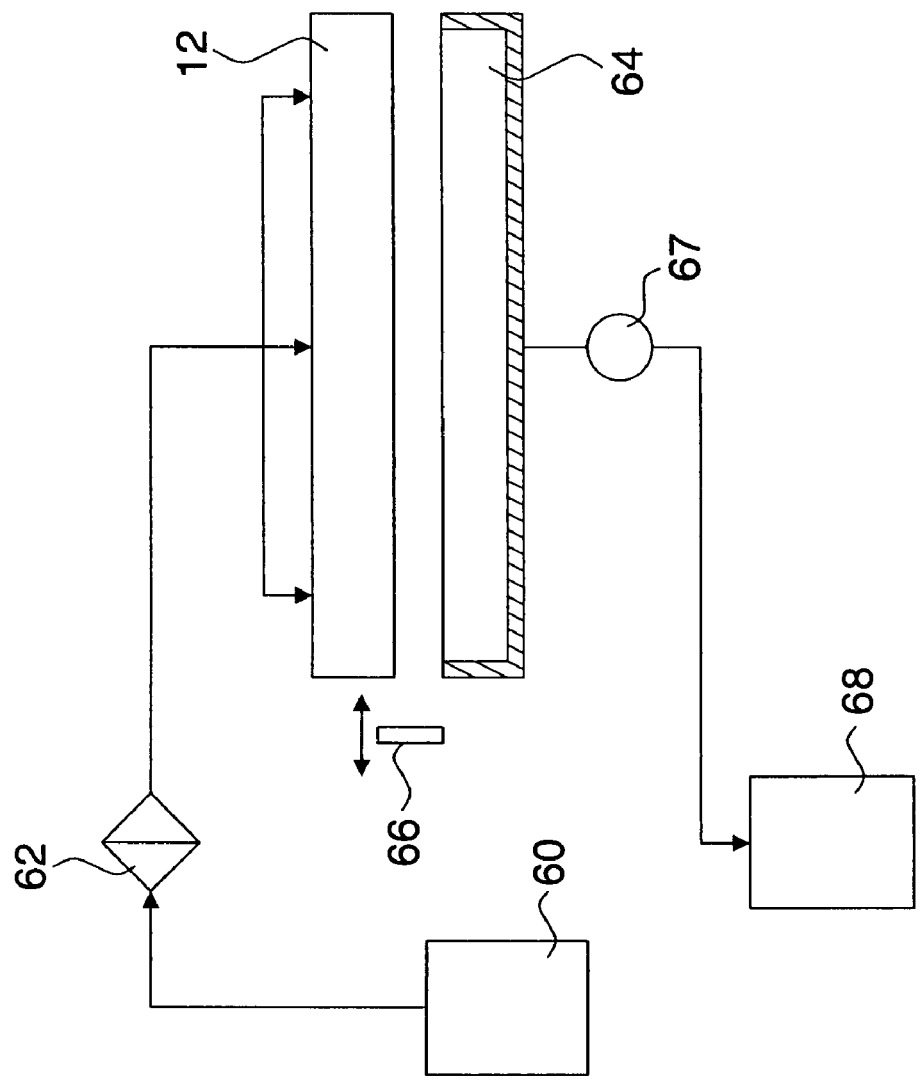
FIG. 6 is a cross-sectional diagram showing the composition of a resist liquid supply system of the liquid-jet recording apparatus shown in FIG. 2.

Next, the general composition of the resist liquid supply system of the liquid-jet recording apparatus 10 is described below. FIG. 6 is a schematic drawing showing the configuration of the resist liquid supply system in the liquid-jet recording apparatus 10.

The resist liquid supply tank 60 is a base tank that supplies resist liquid and is set in the resist liquid storing and loading unit 14 described with reference to FIG. 2. The aspects of the resist liquid supply tank 60 include a refillable type and a cartridge type: when the remaining amount of resist liquid is low, the resist liquid tank 60 of the refillable type is filled with resist liquid through a filling port (not shown) and the resist liquid tank 60 of the cartridge type is replaced with a new one. In the case of changing the resist liquid type in accordance with the intended application, the cartridge type is suitable, and it is preferable to represent the resist liquid type information with a bar code or the like on the cartridge, and perform ejection control in accordance with the resist liquid type.

A filter 62 for removing foreign matter and bubbles is disposed between the resist liquid supply tank 60 and the head 12 as shown in FIG. 6. The filter mesh size of the filter 62 is preferably equivalent to or less than the diameter of nozzle and commonly about 20 μm.

It is preferable to provide a sub-tank (not shown in the drawings) integrally to the head 12 or the periphery of the head 12. The sub-tank has a damper function for preventing variation in the internal pressures of the pressure chambers 52 and the common liquid chamber 55 and a function for improving refilling of the print head.

Possible modes for controlling the internal pressure of the common liquid chamber 55 by means of the sub tank include: a mode where the internal pressure of the pressure chambers 52 is controlled by the differential in the resist liquid level between the sub tank which is open to the external air and the pressure chambers 52 inside the head 12; and a mode where the internal pressures of the sub tank and the pressure chambers 52 are controlled by a pump connected to the sealed sub tank; and the like. Either of these modes may be adopted.

Description of Maintenance of Head

As shown in FIG. 6, a cap 64 forming a device for preventing the drying of the nozzles 51 and increase in the viscosity of the resist liquid in the vicinity of the nozzles 51 is provided in the liquid-jet recording apparatus 10, and a blade 66 is provided as a device for cleaning (wiping) the nozzle forming surface on which the nozzles 51 are formed.

The maintenance unit including the cap 64 and blade 66 can be moved relatively with respect to the head 12 by a movement mechanism (not shown), and is moved from a predetermined holding position to a position below the head 12, as and when required.

The cap 64 shown in FIG. 6 has a size which enables it to cover the whole of the nozzle forming surface of the head 12. The cap 64 is displaced up and down relatively with respect to the head 12 by an elevator mechanism (not shown). When the power is turned OFF or when in a print standby state, the cap 64 is raised to a predetermined elevated position so as to come into close contact with the head 12 (nozzle forming surface of head 12), and the nozzle forming surface is thereby covered with the cap 64.

During printing or standby, if the use frequency of a particular nozzle 51 is low, and if a state of not ejecting resist liquid continues for a prescribed time period or more, then the solvent of the resist liquid in the vicinity of the nozzle evaporates and the viscosity of the resist liquid increases. In a situation of this kind, it may become impossible to eject resist liquid from the nozzle 51, even if the piezoelectric element 58 (see FIG. 5) is operated.

Therefore, before a situation of this kind develops (while the ink is in a range of viscosity which allows it to be ejected by operation of the piezoelectric element 58), the piezoelectric element 58 is operated, and a preliminary ejection ("purge", "blank ejection" or "liquid ejection") is carried out toward the cap 64 in FIG. 6, in order to expel the degraded resist liquid (namely, the resist liquid in the vicinity of the nozzle which has increased viscosity).

This suction operation is also carried out when resist liquid is loaded into the head 12 for the first time, or in order to remove degraded resist liquid which has increased in viscosity and solidified when the head starts to be used after having been out of use for a long period of time. Since the suction operation is carried out with respect to all of the resist liquid inside the pressure chambers 52, the consumption of resist liquid is considerably large. Therefore, desirably, preliminary ejection is carried out while the increase in the viscosity of the resist liquid is still minor. If an air bubble is present in a pressure chamber 52 (see FIG. 5), then a pressure loss occurs when the piezoelectric element 58 is operated, and therefore, nozzle suctioning is carried out with the object of removing such air bubbles inside the pressure chambers 52.

The blade 66 shown in FIG. 6 functions as a wiping device for removing dirt from the nozzle forming surface by moving while pressing against the nozzle forming surface, and a hard rubber material, or the like, is suitable for use in the blade 66. In other words, the blade 66 has a prescribed strength (rigidity) and a prescribed elasticity, and the surface thereof has prescribed hydrophobic properties which repulse the resist liquid from its surface. The blade 66 is constituted by a member which is capable of wiping and removing resist liquid (resist liquid that has solidified on the nozzle forming surface), paper dust, and other foreign matter, which have adhered to the nozzle forming surface.

Furthermore, although not shown in FIG. 6, the head maintenance mechanism (head maintenance device) of the liquid-jet recording apparatus 10 comprises: a blade elevator mechanism (not shown), which moves the blade 66 in the upward and downward directions and thus switches the blade 66 between states of contact and non-contact with the nozzle forming surface; and a cleaning device which removes foreign matter adhering to the blade 66.

Description of Control System

Next, a control system of the liquid-jet recording apparatus 10 according to the present embodiment is described below. FIG. 7 is a principal block diagram showing a system configuration of the liquid-jet recording apparatus 10. The liquid-jet recording apparatus 10 comprises a communications interface 70, a system controller 72, a memory 74, a motor driver 76, a heater driver 78, an ejection control unit 80, a buffer memory 82, a head driver 84, and the like.

The communications interface 70 is an interface unit for receiving resist pattern data sent from a host computer 86. A serial interface such as USB (Universal Serial Bus), IEEE1394, Ethernet (registered trademark), wireless network, or a parallel interface such as a Centronics interface may be used as the communications interface 70. A buffer memory may be mounted in this portion in order to increase the communication speed. The resist pattern data sent from the host computer 86 is received by the liquid-jet recording apparatus 10 through the communications interface 70, and is temporarily stored in the memory 74. The memory 74 is a storage device for temporarily storing resist pattern inputted through the communications interface 70, and data is written and read to and from the memory 74 through the system controller 72. The memory 74 is not limited to a memory composed of semiconductor elements, and a hard disk drive or another magnetic medium may be used.

The system controller 72 is a control unit for controlling the various sections, such as the communications interface 70, the memory 74, the motor driver 76, the heater driver 78, and the like. The system controller 72 is constituted by a central processing unit (CPU) and peripheral circuits thereof, and the like, and in addition to controlling communications with the host computer 86 and controlling reading and writing from and to the memory 74, and the like, the system controller 72 also generates control signals for controlling the motor 88 of the conveyance system and the heater 89.

The motor driver 76 is a driver (drive circuit) that drives the motor 88 of the conveyance system in accordance with commands from the system controller 72.

The heater driver 78 is a driver which drives the heater 89 in accordance with instructions from the system controller 72. The heater 89 shown in FIG. 7 includes a heater used in the curing process unit 23 in FIG. 2, a heater 37 incorporated into the belt 33, and temperature adjustment heaters of the respective heads 12, and the like.

The ejection control unit 80 has a signal processing function for performing various tasks, compensations, and other types of processing for generating ejection control signals from the resist pattern data stored in the memory 74 in accordance with the control of the system controller 72 so as to supply the generated ejection control signal (ejection data) to the head driver 84. Required signal processing is carried out in the ejection control unit 80, and the ejection amount and the ejection timing of the resist liquid from the head 12 are controlled via the head driver 84, on the basis of the resist pattern data. Thereby, a resist pattern having a desired pattern width and pattern shape is obtained.

In other words, when resist pattern data is acquired, the volume of resist liquid ejected in one ejecting action is determined from the width of the resist pattern, and the number of accumulated layers of resist liquid necessary to obtain the required thickness of the resist layer 5 is also determined. Furthermore, the ejection positions of the resist liquid are determined on the basis of the shape of the resist pattern.

The ejection control unit 80 is provided with the buffer memory 82; and resist pattern data, parameters, and other data are temporarily stored in the buffer memory 82 when resist pattern data is processed in the ejection control unit 80. The aspect shown in FIG. 7 is one in which the buffer memory 82 accompanies the ejection control unit 80; however, the memory 74 may also serve as the buffer memory 82. Also possible is an aspect in which the ejection control unit 80 and the system controller 72 are integrated to form a single processor.

The head driver 84 drives the piezoelectric elements 58 (see FIG. 5) of the head 12 on the basis of ejection data supplied by the ejection control unit 80. The head driver 84 can be provided with a feedback control system for maintaining constant drive conditions for the print head.

The program storage unit 90 stores control programs for the liquid-jet recording apparatus 10, and the system controller 72 reads out the various control programs stored in the program storage unit 90, as and when appropriate, and executes the control programs.

As shown in FIG. 2, the ejection determination unit 24 is a block which includes a line sensor, reads in a resist pattern (the dots forming a resist pattern) formed on the substrate 2, carries out required signal processing, and the like, and determines the ejection status of the resist liquid (the presence or absence of ejection, variation in the deposition position and dot diameter, positional displacement of the layered resist liquid, and so on). The determination results are supplied to the ejection control unit 80. According to requirements, the ejection control unit 80 makes various corrections with respect to the head 12 on the basis of information obtained from the ejection determination unit 24.

For example, there is a mode where, if a fault is discovered in the resist pattern, then the fault position and the nozzle corresponding to the fault position are identified, and the formation of the resist layers on the next substrate is controlled in such a manner that correctional ejection is made by using another nozzle which is adjacent to the identified nozzle.

The determination signals output from the supply side sensor and the output side sensor (not shown) described above are supplied to the system controller 72, and it is judged whether or not there is a substrate 2 on the recording medium conveyance path of the belt 33.

FIG. 7 shows the memories as separate memories according to the contents of the information stored therein, but these memories can be formed as shared memories or separate memories, accordingly. Moreover, the invention is not limited to a mode where the memories are attached to the system controller 72 and the ejection control unit 80, and it is also possible to use the internal memory of the processors which constitute the system controller 72 and the ejection control unit 80.

Detailed Description of Resist Layer Formation

Figure 8A:
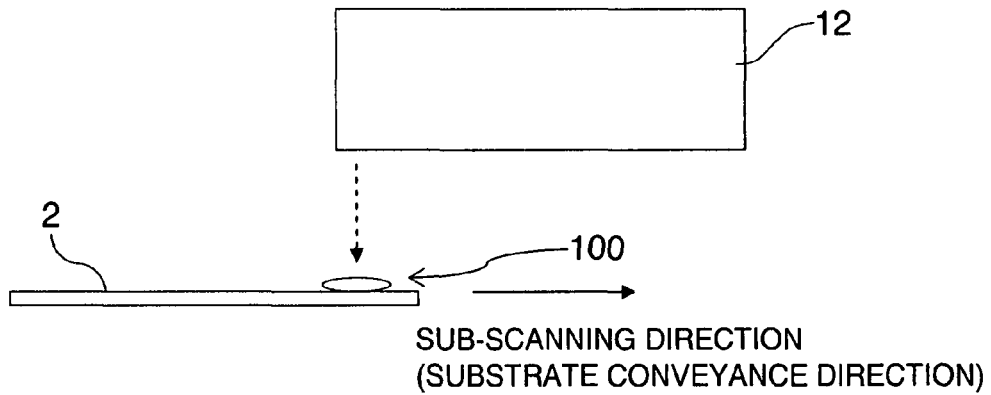
FIGS. 8A to 8C are diagrams illustrating resist liquid ejection in the liquid-jet recording apparatus shown in FIG. 2.
Figure 8B:
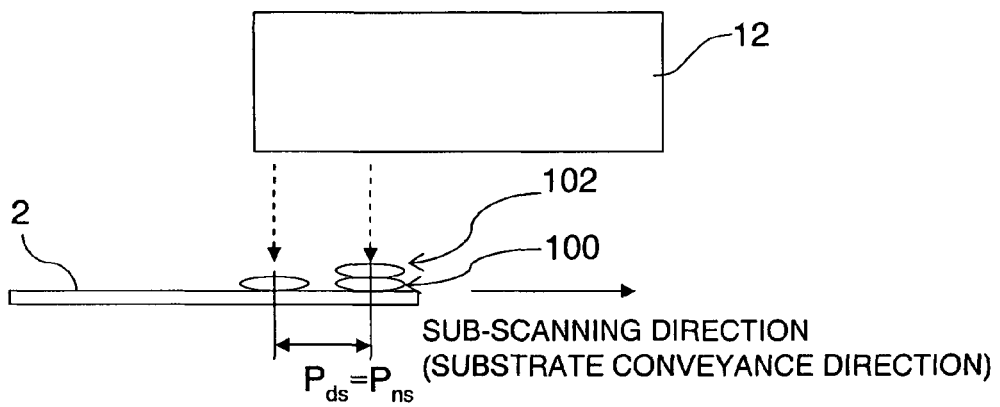
Figure 8C:
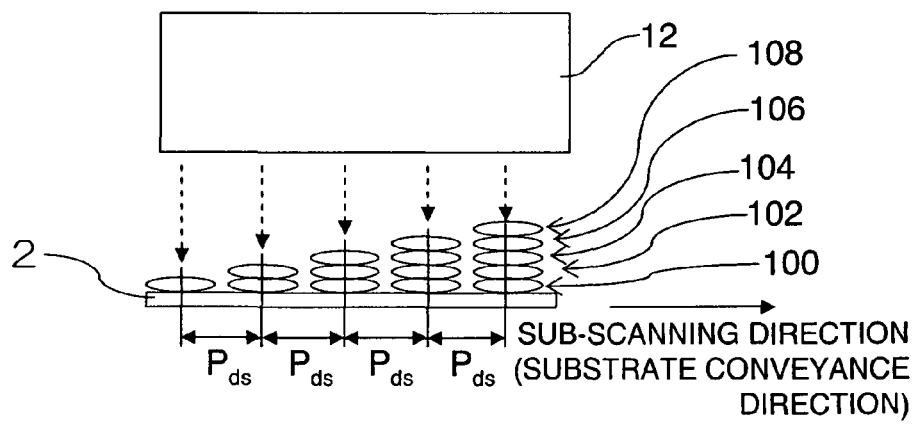

FIGS. 8A to 8C are general schematic drawings showing a sequence of a situation where resist liquid ejected from the head 12 is accumulated. In the liquid-jet recording apparatus 10 according to the present embodiment, a resist layer 5 having a prescribed film thickness is formed on the substrate 2 (see FIGS. 1A to 1R) by accumulating layers of a plurality of droplets of resist liquid, on the same position on the substrate 2, the resist liquid droplets being ejected from a plurality of different nozzles arranged equidistantly in the sub-scanning direction (the nozzle pitch $P_{ns}$ in the sub-scanning direction).

FIG. 8A shows a state where resist liquid 100 forming a first layer has been deposited on the substrate 2, from a nozzle of the first row (a nozzle belonging to the nozzle row on the furthest upstream side in terms of the substrate conveyance direction shown in FIGS. 4A and 4B). When the substrate 2 has been conveyed in the substrate conveyance direction by a distance corresponding to the nozzle pitch $P_{ns}$ in the sub-scanning direction, then resist liquid 102 for a second layer is ejected onto the same position as the deposition position of the resist liquid 100 of the first layer, from a nozzle of the second row, which is mutually adjacent in the sub-scanning direction to the nozzle of the first row which has ejected the resist liquid of the first layer, and the resist liquid 102 of the second layer accumulates as a layer on top of the resist liquid 100 of the first layer.

FIG. 8B shows a state where the resist liquid 102 of the second layer has been superimposed on top of the resist liquid 100 of the first layer. Since the resist liquid 100 of the first layer has cured (or semi-cured) on the substrate 2 by the time that the resist liquid 102 of the second layer is ejected, then when the resist liquid 102 of the second layer accumulates on top of the resist liquid 100 of the first layer, the resist liquid 102 of the second layer does not spread over the substrate 2. An example is shown here where the dot pitch $P_{ds}$ in the sub-scanning direction between the resist liquids 100 of the first layer is the same as the nozzle pitch $P_{ns}$ in the sub-scanning direction (see FIG. 4A), but the configuration is not limited to this.

In this way, by ejecting resist liquid in sequence, from the nozzles arranged in the sub-scanning direction, starting from the nozzle on the furthest upstream side in the substrate conveyance direction, while conveying the substrate 2 in the substrate conveyance direction through the nozzle pitch $P_{ns}$ in the sub-scanning direction after each ejecting action, then the resist liquid ejected from the plurality of different nozzles arranged in the sub-scanning direction is accumulated to a prescribed thickness.

FIG. 8C shows a state where the resist liquid 102 of the second layer has been superimposed on top of the resist liquid 100 of the first layer, at the same position on the substrate 2, and furthermore, resist liquid 104 for a third layer ejected from a nozzle of the third row, resist liquid 106 for a fourth layer ejected from a nozzle of the fourth row, and resist liquid 108 for a fifth layer ejected from a nozzle of the fifth row have been superimposed thereon. FIG. 8C shows a schematic view of a state where resist liquid in five layers has been formed, but in actual practice, resist liquid is accumulated until the resist layer 5 assumes a prescribed thickness. In the example shown here, the dot pitch $P_{ds}$ in the sub-scanning direction between the accumulated dot groups is the same as the nozzle pitch $P_{ns}$ in the sub-scanning direction, but the configuration is not limited to this.

In this way, a resist pattern having a prescribed thickness is formed over the whole surface of the substrate 2 while conveying the substrate 2 and the head 12 relatively with respect to each other.

The liquid-jet recording apparatus 10 having the composition described above has a full line type of head 12 in which a plurality of nozzles are arranged in a sub-scanning direction which is parallel to the relative conveyance direction of the substrate 2, as well as being arranged through a length corresponding to the length of the substrate in the main scanning direction, which is perpendicular to the relative conveyance direction of the substrate, and when forming a resist layer 5 having a prescribed pattern on a substrate 2 by ejecting a resist liquid onto the substrate 2 by scanning the substrate 2 and the head 12 relatively just once in the sub-scanning direction, resist liquid ejected successively onto the same position of the substrate 2 from different nozzles arranged in the sub-scanning direction is accumulated in layers; therefore, the subsequent resist liquid is superimposed onto resist liquid deposited previously onto the substrate 2 after the previously deposited resist liquid has assumed a cured or semi-cured state, thereby making it possible to prevent displacement in the superimposition of the resist liquid in the main scanning direction, in such a manner that a desirable resist layer 5 having a desired thickness is formed.

Furthermore, since nozzles equal to or greater than the maximum number of layers of resist liquid are arranged in the sub-scanning direction, it is possible to form a resist layer 5 having a prescribed thickness by means of a single-pass scanning method, as well as preventing any decline in productivity even when forming a resist layer 5 by accumulating a plurality of layers of resist liquid.

In particular, in the case of a substrate which uses resin for the insulation layer 1 in FIGS. 1A to 1R, such as a flexible substrate, there is significant expansion and contraction due to temperature change, and therefore the composition according to the present embodiment is desirable, since it enables the time interval between the patterning of a first layer and the patterning of a second layer to be shortened to a minimum by means of a single-pass scanning method (the deposition of all resist liquid layers is completed by means of one scanning action in the sub-scanning direction by means of a nozzle group arranged in the sub-scanning direction).

The present embodiment relates to a mode where the substrate 2 is moved in the sub-scanning direction with respect to the fixed head 12, but it is also possible to move the head 12 in the sub-scanning direction with respect to the fixed substrate 2, and it is also possible to move both the substrate 2 and the head 12 in the sub-scanning direction (in opposite directions).

Second Embodiment

Figure 9A:
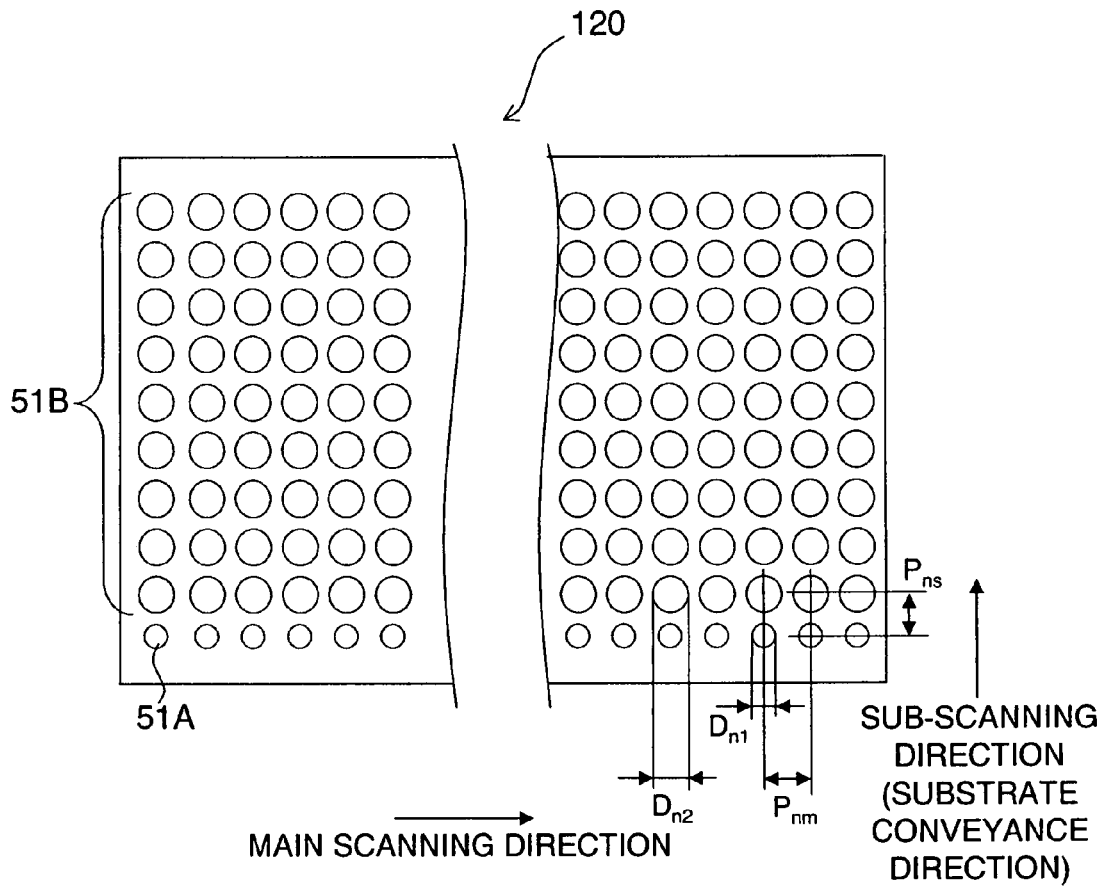
FIGS. 9A and 9B are plan diagrams showing nozzle arrangements in a head provided in a liquid-jet recording apparatus relating to a second embodiment of the present invention.

Next, a second embodiment of the present invention is described below. FIG. 9A is a plan diagram showing the nozzle arrangement in a head 120 relating to the second embodiment of the present invention. In the second embodiment described below, items which are the same as or similar to those in the first embodiment described above are labeled with the same or similar reference numerals and description thereof is omitted here.

The head 120 shown in FIG. 9A has the same nozzle arrangement as the head 12 having the arrangement shown in FIG. 4A, and it is a full line head in which a plurality of nozzles are aligned through a length of the substrate 2 corresponding to the main scanning direction, which is the breadthways direction of the substrate 2 (see FIG. 3), and ten nozzles (a number of nozzles corresponding to the maximum number of accumulated layers of resist liquid) are arranged equidistantly at an arrangement pitch of $P_{ns}$ in the sub-scanning direction, which is the direction of relative movement of the substrate 2 and the head 120.

Of the ten nozzles aligned in the sub-scanning direction of the head 120, the nozzle 51A of the first row which is disposed on the furthest upstream side in the substrate conveyance direction and which is disposed through the full width of the main scanning direction (the nozzle which ejects resist liquid initially, of the nozzles aligned in the sub-scanning direction) has a smaller diameter than the nozzles 51B of the second row to tenth row. The relationship between the diameter $D_{n1}$ of a nozzle 51A of the first row and the diameter $D_{n2}$ of nozzles 51B of the respective second row to tenth row is $D_{n1} < D_2$. Furthermore, the diameter $D_{d1}$ of a dot formed by resist liquid ejected from a nozzle 51A of the first row and the pitch $P_{nm}$ in the main scanning direction between the nozzles 51A of the first row have a relationship of $D_{d1} < P_{nm}$.

Here, the nozzle pitch $P_{nm}$ in the main scanning direction between the nozzles 51A of the first row is the distance between the centers of nozzles 51A of the first row which are mutually adjacent in the main scanning direction.

The diameter of the dots can be changed by altering the drive waveform of the piezoelectric elements 58 (see FIG. 5) or the diameter of the nozzles. In general, it is possible to form dots of smaller diameter, the smaller the diameter of the nozzle. If small dots are formed, then their thickness also becomes small, and therefore it is desirable to increase the number of deposited layers suitably, in order to obtain a resist film of the prescribed thickness.

Figure 9B:
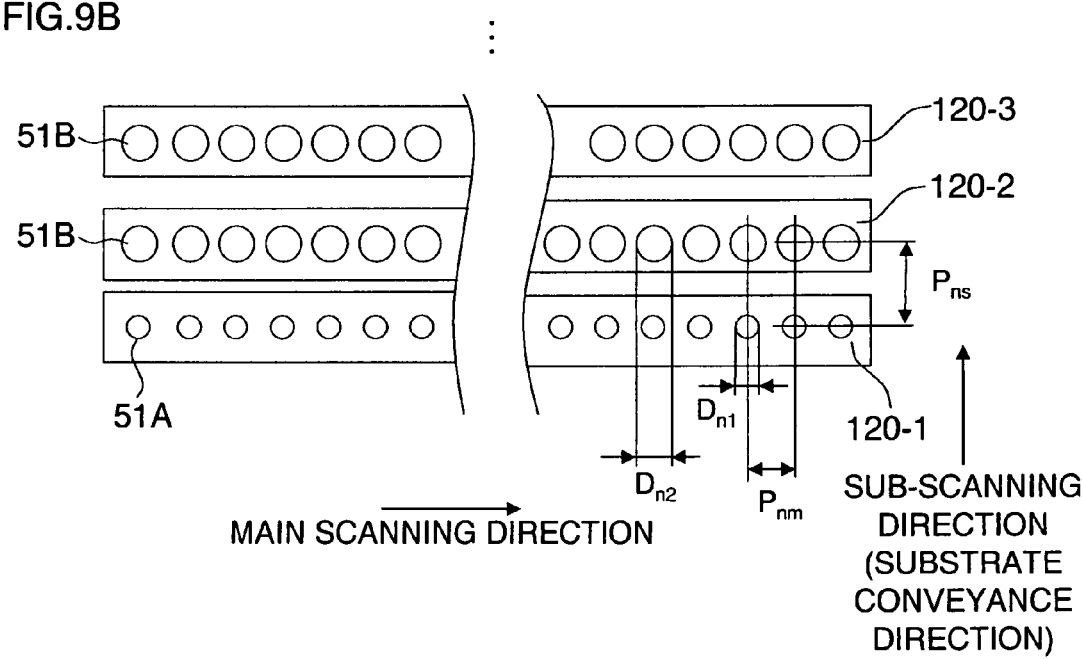

In a mode where ten head blocks 120-1, 120-2, . . . are arranged in the sub-scanning direction, each head block comprising only one nozzle row having a plurality of nozzles arranged in the main scanning direction as shown in FIG. 9B, then the diameter $D_{n1}$ of a nozzle 51A of the head block 120-1 of the first row on the furthest upstream side in the substrate conveyance direction is smaller than the diameter $D_{n2}$ of nozzles 51B of the respective head blocks 120-2, 120-3, . . . of the second and subsequent rows. Furthermore, the diameter $D_{d1}$ of the dots formed by resist liquid ejected from the nozzles 51A of the head block 120-1 of the first row and the nozzle pitch $P_{nm}$ in the main scanning direction of the head block 120-1 of the first row have the relationship of $D_{d1} < P_{nm}$.

In other words, the resist liquid of the first layer which is ejected from the nozzle 51 of the first row has a diameter $D_{d1}$ whereby droplets of resist liquid deposited onto the substrate 2 at mutually adjacent positions in the main scanning direction do not make contact with each other, and therefore, unification (landing interference) does not occur on the substrate 2 between two droplets of resist liquid of the first layer which are mutually adjacent in the main scanning direction and which are ejected from nozzles 51A of the first row.

In other words, taking the dot pitch in the main scanning direction to be $P_{dm}$ and taking the dot diameter to be $D_{d1}$, a dot of the first layer (reference numeral 140 in FIG. 10B) formed by means of resist liquid of the first layer ejected from a nozzle 51A of the first row has the relationship of $D_{d1} < P_{dm}$ (see FIG. 11A), and therefore the resist liquid of the first layer ejected from the nozzles 51A of the first row fixes without the occurrence of unification between resist liquid droplets on the substrate 2 which are mutually adjacent in the main scanning direction. Consequently, movement of the liquid in the main scanning direction on the substrate 2 is prevented, and there is no positional displacement in the resist liquid of the first layer.

The resist liquid of the second layer ejected from a nozzle 51B for the second layer (reference numeral 142 in FIG. 10B) has high affinity with the resist liquid of the first layer, and even if respective resist liquid droplets of the second layer make contact with each other and become unified, movement of the resist liquid (dots) of the second layer in the main scanning direction is prevented by the resist liquid of the first layer.

Figure 10A:
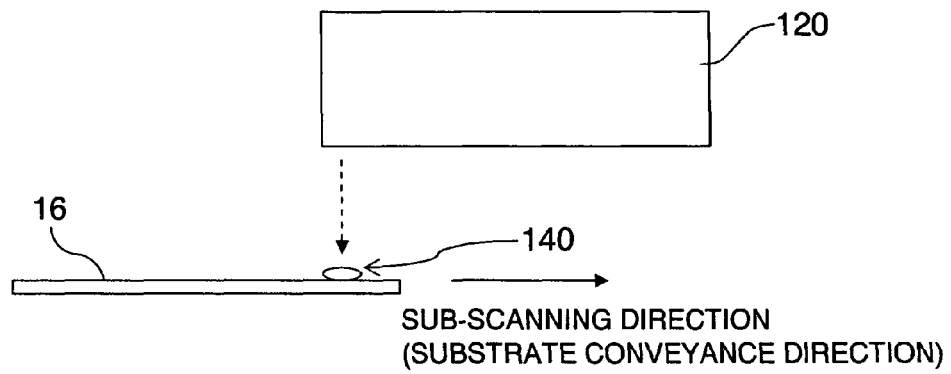
FIGS. 10A to 10C are conceptual diagrams illustrating resist liquid ejection in the liquid-jet recording apparatus shown in FIGS. 9A and 9B.
Figure 10B:
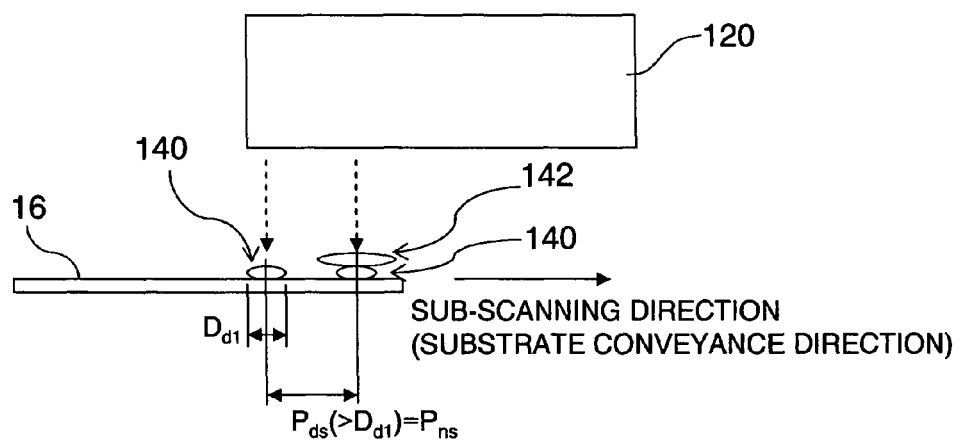
Figure 10C:
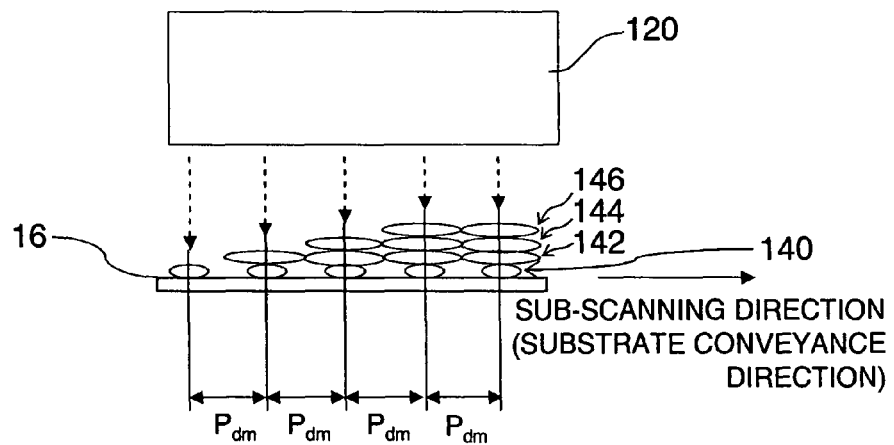
Figure 11A:
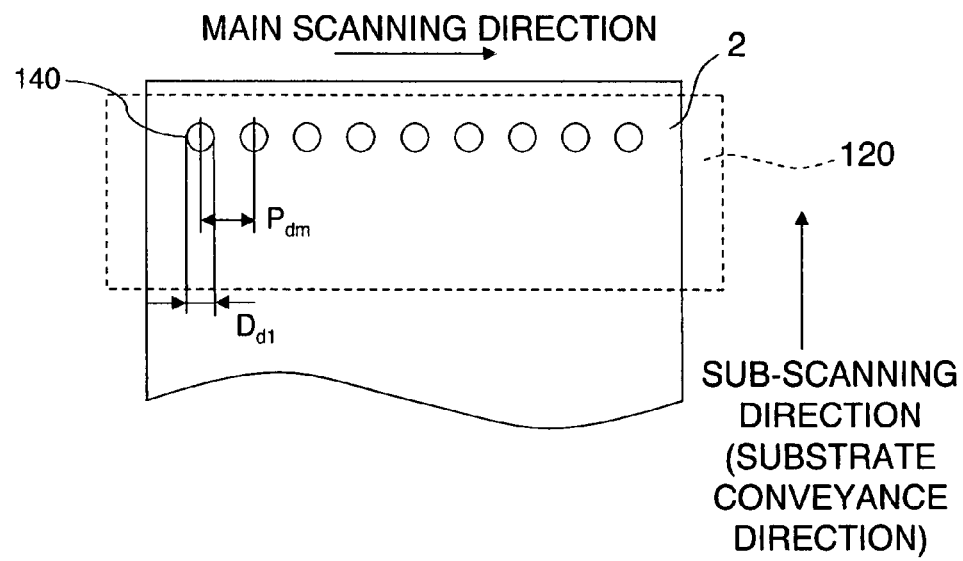
FIGS. 11A and 11B are diagrams illustrating an arrangement of dots formed by the liquid-jet recording apparatus shown in FIGS. 9A and 9B.

FIGS. 10A to 10C are diagrams showing a situation where a resist layer is formed on a substrate 2 by ejecting resist liquid from the head 120 shown in FIG. 9A or the head blocks 120-1, 120-2, . . . , 120-10 shown in FIG. 9B.

The state shown in FIG. 10A is a state where resist liquid (dots) 140 of the first layer ejected from nozzles 51A of the first row have been fixed on the substrate 2. The resist liquid 140 of the first layer ejected from the nozzles 51A of the first row has a diameter whereby resist liquid droplets which are mutually adjacent in the main scanning direction do not make contact with each other (see FIG. 11A), and they become fixed on the substrate 2 before the resist liquid of the second layer (reference 142 in FIG. 10B) is deposited on top of the resist liquid 140 of the first layer. In the resist liquid of the first layer, since there is no contact between the resist liquid droplets which are mutually adjacent in the main scanning direction, then there is no unification of these droplets and the resist liquid droplets of the first layer are fixed respectively and independently on the substrate 2.

Figure 11B:
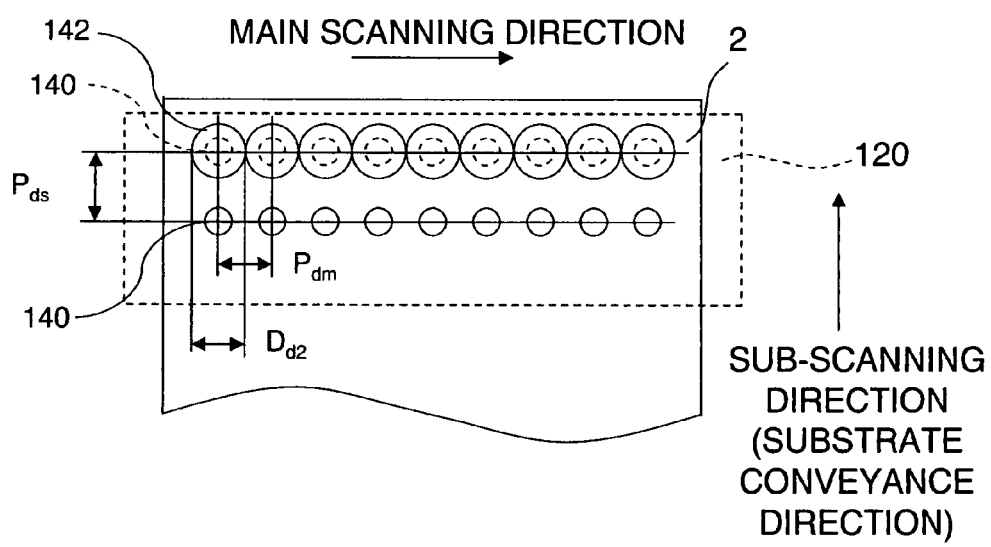

FIG. 10B shows a state where resist liquid 142 of the second layer ejected from nozzles 51B of the second row has been deposited onto the resist liquid 140 of the first layer previously fixed on the substrate. As shown in FIG. 11B, the resist liquid 142 of the second layer (indicated by the solid line) ejected from the nozzles 51B of the second row has a diameter whereby resist liquid droplets which are mutually adjacent in the main scanning direction on the substrate 2 make contact with each other (in other words, the diameter $D_{d2}$ of the resist liquid of the second layer is greater than the droplet ejection pitch $P_{dm}$ in the main scanning direction of the resist liquid droplets of the second layer), and therefore unification occurs between the resist liquid droplets of the second layer, but there is no movement of the droplet ejection positions and spreading and wetting thereof is suppressed in such a manner that the resist liquid 142 of the second layer is superimposed on the resist liquid 140 of the first layer. The dot pitch in the main scanning direction between the dots of the first layer (the nozzle pitch between the nozzles of the first row), and the dot pitch in the main scanning direction between the dots of the second layer (the nozzle pitch between the nozzles of the second row) are the same pitch.

Furthermore, looking specifically at the resist liquid 140 of the first layer, the dot pitch $P_{ds}$ in the sub-scanning direction is a value which exceeds the diameter $D_{d1}$ of the resist liquid 140 of the first layer (in other words, $P_{ds} > D_{d1}$).

FIG. 10C shows a state where the resist liquids 144 and 146 of the third and subsequent layers ejected from the nozzles 51B of the third and subsequent rows have been deposited onto the resist liquid 140 of the first layer and the resist liquid 142 of the second layer. In this way, the resist liquid is accumulated in layers until reaching a prescribed thickness.

Figure 12A:
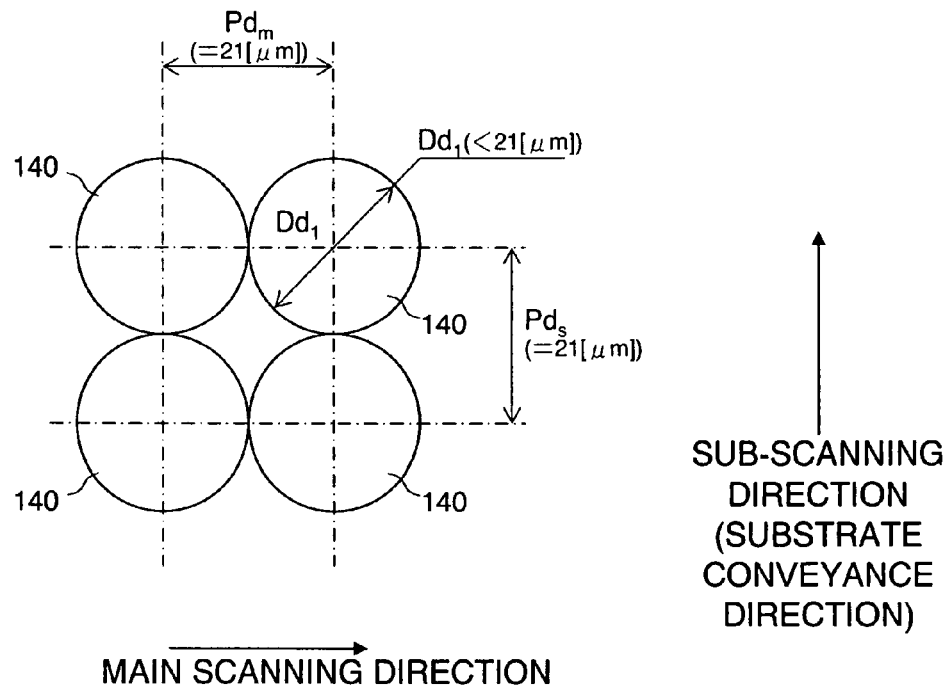
FIGS. 12A and 12B are diagrams for describing the details of the dots.
Figure 12B:
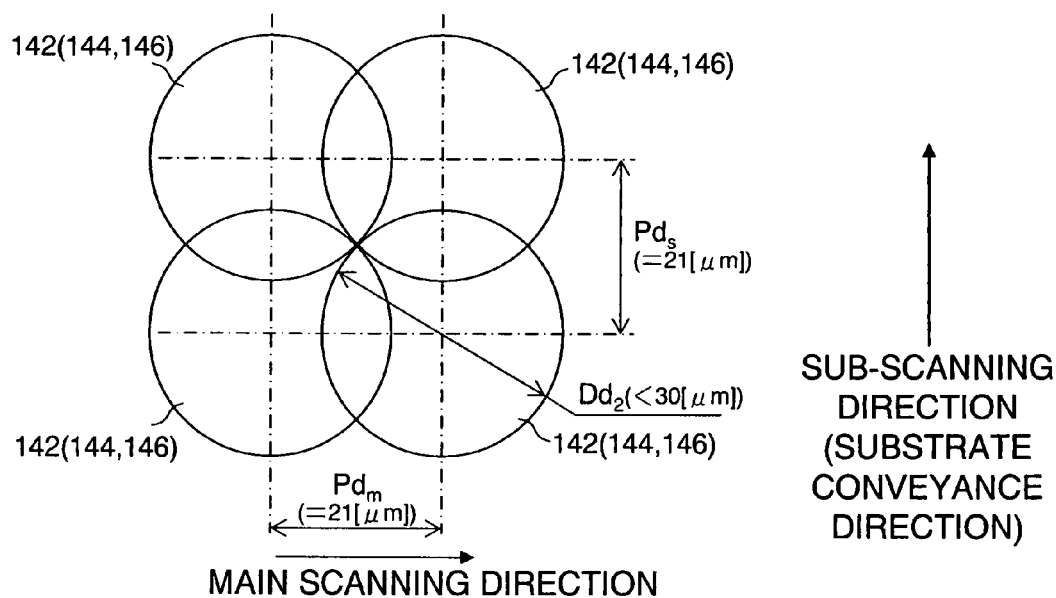

FIG. 12A shows one example of dots formed by the resist liquid 140 of the first layer, and FIG. 12B shows one example of dots formed by the resist liquid of the second and subsequent layers (reference numerals 142, 144, 146, and so on in FIG. 10C). In FIG. 12A, the dots 140 of the first layer are depicted as being in mutual contact, but in actual practice, the dots 140 of the first layer do not make contact with each other.

If the image resolution of the resist pattern is 1200 dpi, and assuming that the dot pitch $P_{ds}$ in the sub-scanning direction between the dots 140 of the first layer (which is determined by the ejection timing (ejection interval)) is the same as the dot pitch $P_{dm}$ in the main scanning direction (which is determined by the arrangement pitch of the nozzles in the main scanning direction), then $P_{dm}$ is given by the following.

$P_{dm} = P_{ds} = 25.4 \times 10^3$ (µm)/1200 ≈ 21 (µm)

In other words, the diameter $D_{d1}$ of the dots 140 of the first layer is:

$D_{d1} < 21$ (µm)

In a normal liquid-jet method, variation in the dot formation positions (ink deposition positions) is unavoidable, and supposing that the variation in the dot formation position is ±2 µm, then a more desirable condition is as follows.

$D_{d1} < 17$ (µm)

It is possible to determine values for other image resolutions in a similar fashion.

FIG. 12B shows one example of dots formed by the resist liquids 142, 144, 146, . . . of the second and subsequent layers.

The conditions of the diameter $D_{d2}$ of the dots 142 formed by the resist liquid of the second layer in order that the ink completely covers the substrate (underlying layer) 2 are as follows.

$D_{d2} > P_{ds}$ and $D_{d2} > P_{dm}$

The minimum value of the diameter $D_{d2}$ of the dots 142 of the second layer when the dots 142 of the second layer overlap in the main scanning direction, the sub-scanning direction and the oblique direction is 21 µm ($= P_{ds} = P_{dm}$)×$2^{1/2}$ ≈ 30 (µm), and therefore the following is satisfied.

$D_{d2} > 30$ (µm)

In a normal liquid-jet method, variation in the dot formation position (ink deposition positions) is unavoidable, and supposing a variation in the dot formation positions of ±2 µm, then in order that the substrate 2 is covered with resist liquid even in cases where there is variation in the dot formation positions, desirably, the following is satisfied.

$D_{d2} > 34$ (µm).

The actual liquid droplet volumes required to achieve the diameter $D_{d1}$ of the dots of the first layer and the diameter $D_{d2}$ of the dots of the second layer described above is decided on the basis of the liquid properties, the angle of contact with respect to the substrate, the solid component density, and the like.

According to the second embodiment described above, the diameter $D_{d1}$ of the dots formed by the resist liquid 140 of the first layer is determined in such a manner that there is no unification between droplets of resist liquid 140 of the first layer which are mutually adjacent in the sub-scanning direction, and the resist liquid 142 of the second layer is deposited onto the resist liquid of the first layer after the resist liquid 140 of the first layer has cured and become fixed to the substrate 2. Therefore, the positional displacement does not occur due to unification of the resist liquid 140 of the first layer, and hence the positional displacement does not occur either in the resist liquid of the second and subsequent layers which is accumulated on top of the resist liquid 140 of the first layer. Therefore, it is possible to obtain a desirable resist pattern which does not give rise to pattern faults.

The second embodiment described above relates to a mode where the diameter $D_{n1}$ of the nozzles 51 of the first row is decided in such a manner that the diameter $D_{d1}$ of the dots formed by the resist liquid ejected from the nozzles 51A of the first row is made to be smaller than the arrangement pitches $P_{ds}$ and $P_{dm}$ of the dots of resist liquid ejected from the nozzles 51A of the first row, but it is also possible to adopt another method. For example, it is also possible to alter the ejection volume of resist liquid (in other words, to alter the diameter of the dots formed by that resist liquid) by changing the drive signal applied to the piezoelectric elements 58 (see FIG. 5). The drive signal can be changed by adjusting the voltage, or by adjusting the pulse width.

In other words, it is desirable to use a head 120 having a relationship of $D_{n1} < D_{n2}$ for the relationship between the diameter $D_{n1}$ of the nozzles 51A of the first row and the diameter $D_{n2}$ of the nozzles of the second row, as shown in FIGS. 9A and 9B, and to select the drive signal (drive waveform) according to the printing conditions, in such a manner that the relationships between the diameter $D_{d1}$ of the dots created by resist liquid ejected from the nozzles 51A of the first row and the arrangement pitches $P_{dm}$ and $P_{ds}$ of the dots created by resist liquid ejected from the nozzles 51A of the first row satisfy: $D_{d1} < P_{dm}$ and $D_{d1} < P_{ds}$.

If the diameter $D_{d1}$ of the dots 140 of the first layer is made smaller than the diameter $D_{d2}$ of the dots 142 of the second layer by changing the drive signal, then it is possible to alter the diameter of the dots appropriately in accordance with various printing conditions (the liquid properties, type of substrate, printing resolution, and the like), (with respect to changing the nozzle diameter, no change in the diameter of the nozzles is possible once the head has been specified), and this is beneficial for performing adjustment in accordance with the printing conditions. On the other hand, if the dot size is adjusted by changing the drive signal, then there are limitations on the range of adjustment (in particular, on the side of reducing the size), and therefore adjustment of the dot size caused by altering the diameter of the nozzles is beneficial in order to change the dots to a minimum diameter.

Modification Example 1

Figure 13:
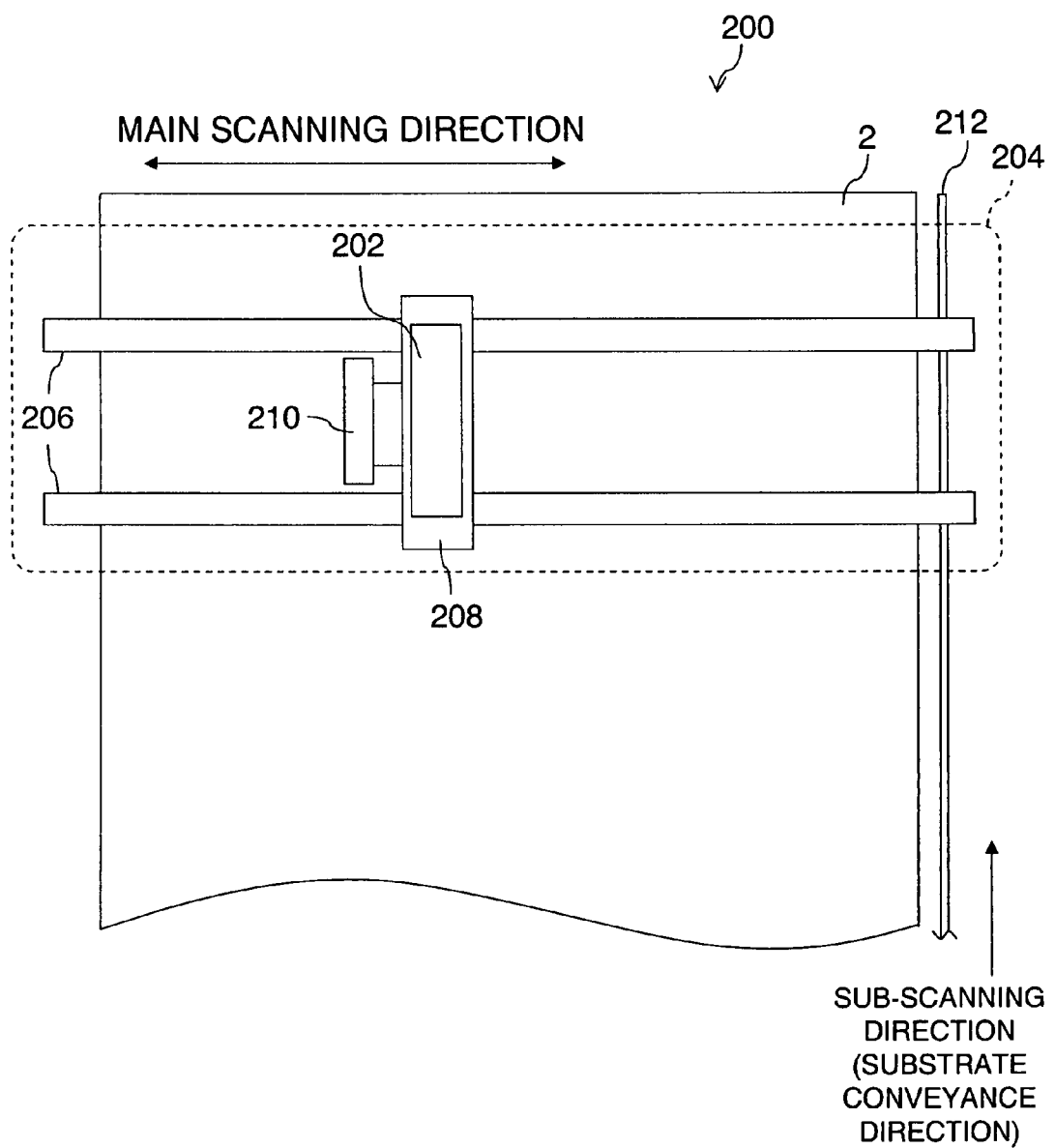
FIG. 13 is a schematic drawing of a liquid-jet recording apparatus relating to a modification example of the present invention.

Next, a modification example of the present invention is described below. FIG. 13 is a general schematic drawing of a liquid-jet recording apparatus 200 relating to the present modification example. Similarly to the liquid-jet recording apparatus 10 described above, the liquid-jet recording apparatus 200 shown in FIG. 13 forms a resist layer having a desired thickness (see FIGS. 1A to 1R) onto a substrate 2, by accumulating layers of resist liquid ejected onto the substrate 2. In the present modification example, the breadthways direction of the substrate 2 (in other words, the direction in which the head 202 moves with respect to the fixed substrate 2) is taken to be the main scanning direction, and the direction in which the substrate 2 is moved with respect to the head 202 is taken as the sub-scanning direction.

The print unit 204 comprises a carriage 208 which is movable reciprocally along two guide rails 206 extending in the main scanning direction, which is the breadthways direction of the substrate 2. A head 202 which ejects resist liquid and a scanner unit 210 are mounted on the carriage 208, and these elements are composed so as to be attachable and detachable with respect to the carriage 208, thereby making it possible to move these elements in the main scanning direction in unison with the carriage 208.

Since the resist liquid used in the present application example is the same as the resist liquid relating to the first and second embodiments described above, description thereof is omitted here.

The scanner unit 210 includes a sensor (not shown) for capturing images of the resist pattern, and this scanner unit 210 functions as a device for checking the ejection state of the head 202 by reading in the resist pattern formed on the substrate 2. In other words, it is possible to determine variations in the each of the nozzles contained in the head 202 (indicated by reference numeral 51 in FIG. 4), by means of the scanner unit 210.

The substrate conveyance amount determination sensor 212 is a device which measures the conveyance amount of the substrate 2 in the sub-scanning direction, and it comprises photoelectric sensors arranged following a substantially parallel direction with respect to the sub-scanning direction. The amount of conveyance of the substrate 2 is determined on the basis of the sensor signal obtained from this conveyance amount determination sensor 212. Instead of a sensor which directly determines the amount of conveyance of the substrate 2, it is also possible to install a rotational amount sensor (rotary encoder) on the shaft of a motor which operates the suction belt conveyance unit 22 shown in FIG. 2, and to determine the amount of conveyance of the substrate 2 on the basis of the amount of rotation of the motor.

Although not shown in the drawing, a heater for pre-heating the substrate 2 before ejection of resist liquid, and a curing process unit 23 for heating and curing the resist liquid on the substrate 2 (see FIG. 2) are provided on the substrate conveyance path of the liquid-jet recording apparatus 200.

Figure 14:
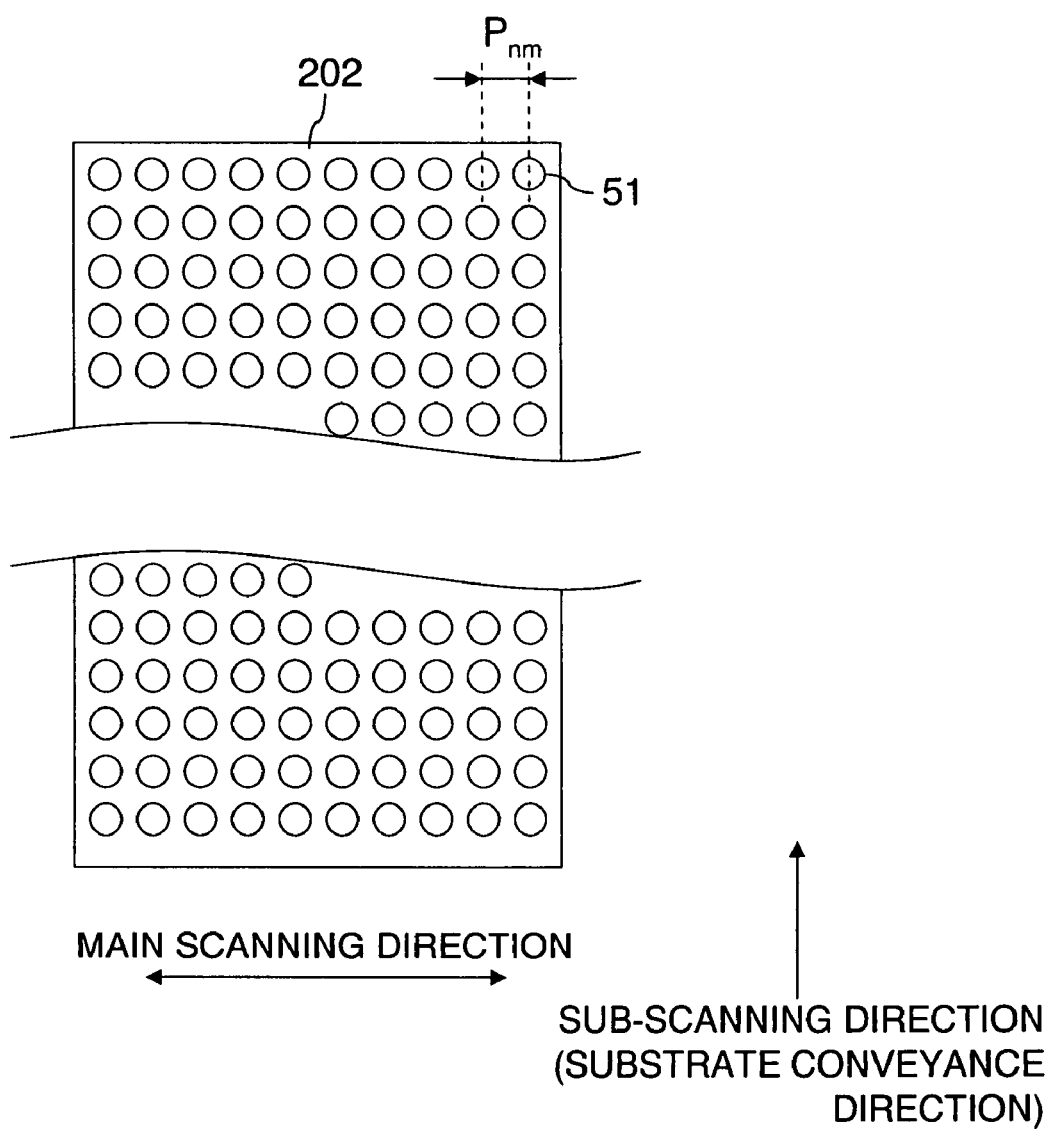
FIG. 14 is a plan diagram showing a nozzle arrangement in a head in the liquid-jet recording apparatus shown in FIG. 13.

FIG. 14 is a diagram showing an example of the arrangement of nozzles 51 of the head 202 shown in FIG. 13. The head 202 has a nozzle arrangement in which ten nozzles 51 (namely, the same number as the maximum number of layers of resist liquid) are aligned equidistantly at an arrangement pitch of $P_m$ in the main scanning direction, and furthermore, n nozzles 51 (where n=1, 2, 3, . . . ) are aligned in the sub-scanning direction.

In other words, the head 202 scans (moves) at a prescribed speed in the main scanning direction, and resist liquid is ejected sequentially from the ten nozzles aligned in the main scanning direction, onto the same position on the substrate 2, starting from the nozzle on the downstream side in terms of the scanning direction (movement direction) of the head 202, thereby forming a resist liquid having a prescribed thickness by accumulating ten layers of resist liquid. The number of nozzles arranged in the main scanning direction is decided on the basis of the maximum number of layers of resist liquid that are to be accumulated, and this is determined by (maximum thickness of the resist layer 5)/(thickness of resist layer created by one ejection action).

In the present embodiment, a single-pass scan is used to form a resist layer over the whole surface of the substrate 2 by scanning (moving relatively) the substrate 2 and the head 202 just once in the sub-scanning direction. In other words, the head 202 is caused to move just once in the main scanning direction, through the region which can be scanned by one scan in the main scanning direction. When one scan in the main scanning direction has been completed, the head 202 and the wiring substrate are relatively moved in the sub-scanning direction, and the head 202 is moved in the main scanning direction, over a different region from the region where scanning in the main scanning direction has been completed.

If the number of nozzles n in the sub-scanning direction is increased, then it is possible to eject a resist liquid onto a larger region by means of a single scan in the main scanning direction. The scanning (movement) of the head 202 in the main scanning direction may be performed by means of unidirectional scanning (unidirectional movement), or it may be performed by reciprocal scanning (reciprocal movement). If the head 202 is moved reciprocally in the main scanning direction, then when scanning in the outward direction has completed, the substrate is conveyed through a prescribed amount, and a different region to the scanning region of the outward scan is scanned in the return scanning action.

Figure 15A:
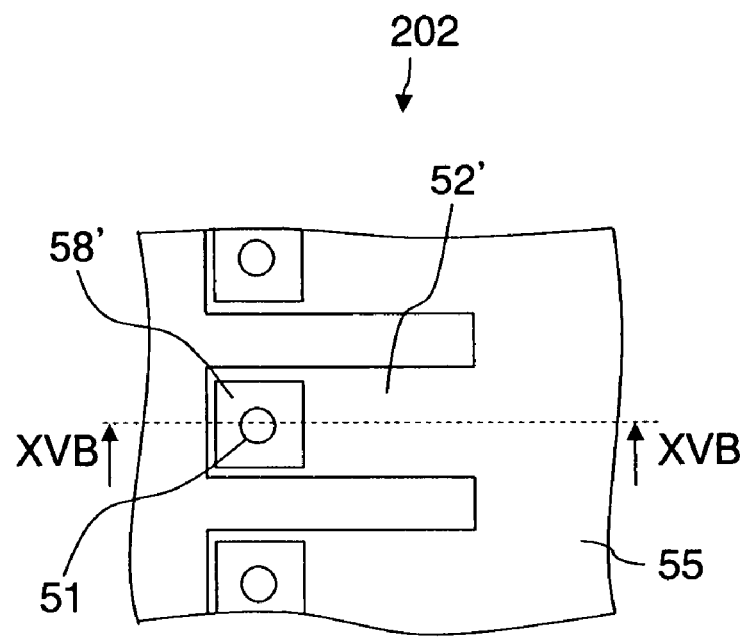
FIGS. 15A and 15B are diagrams illustrating the structure of the head in the liquid-jet recording apparatus shown in FIG. 13.
Figure 15B:
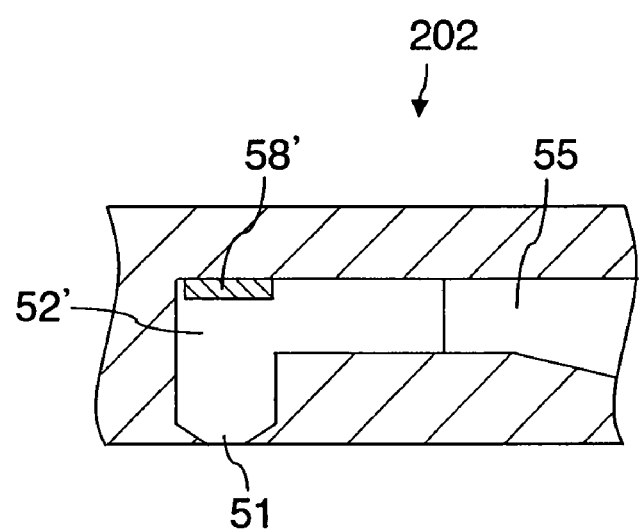

FIGS. 15A and 15B are schematic drawings showing the internal structure of the head 202, where FIG. 15A is a plan view perspective diagram showing a portion of the head, and FIG. 15B is a cross-sectional diagram along line XVB-XVB in FIG. 15A.

For the head 202 in this example, individual flow channels (pressure chambers) 52' are provided so as to correspond respectively to the nozzles 51. A heating element 58' is provided on one side wall of each of the individual flow channels 52', to form ejection devices for ejecting resist liquid from the nozzles 51. In the present example, the heating elements 58' are respectively disposed on the walls opposing the nozzles 51. The individual flow channels 52' are connected to a common liquid chamber 55. Resist liquid supplied from the resist liquid storing and loading unit 14 shown in FIG. 2 is accumulated in the common liquid chamber 55, and the resist liquid is supplied and distributed to the individual liquid chambers 52' from the common liquid chamber 55.

According to a composition of this kind, when a prescribed drive voltage is supplied to a heating element 58', an air bubble grows in the ink inside the individual flow channel 52', due to the heat generated by the heating element 58', and resist liquid is ejected from the nozzle 51 by the pressure created by this air bubble. After the ejection of resist liquid, new resist liquid is supplied to the individual flow channel 52' from the common liquid chamber 55.

FIGS. 15A and 15B show a thermal ejection method as the method for ejecting the resist liquid, but it is of course also possible to use an ejection method which applies an ejection force to the resist liquid inside a pressure chamber by changing the volume of the pressure chamber by means of a bending deformation of a piezoelectric element, as described above. Apart from this, in order to eject the resist liquid, it is also possible to use various other types of ejection method, such as a CIJ (continuous ink jet) method, an electrostatic ejection method, an electrostatic pulling method, and the like.

The present example is described above with respect to a mode where the head 202 is moved with respect to a fixed substrate in the main scanning direction, and the substrate 2 is moved with respect to the fixed head 202 in the sub-scanning direction, but it is also possible for the head 202 to be moved two-dimensionally with respect to a fixed substrate, in both the main scanning direction and the sub-scanning direction.

Modification Example 2

Next, a further modification example of the present invention is described below. Below, a compositional example is described in which the curing process unit 23 (see FIG. 2) cures the resist liquid on the substrate 2, thereby fixing the resist liquid to the substrate 2.

Figure 16:
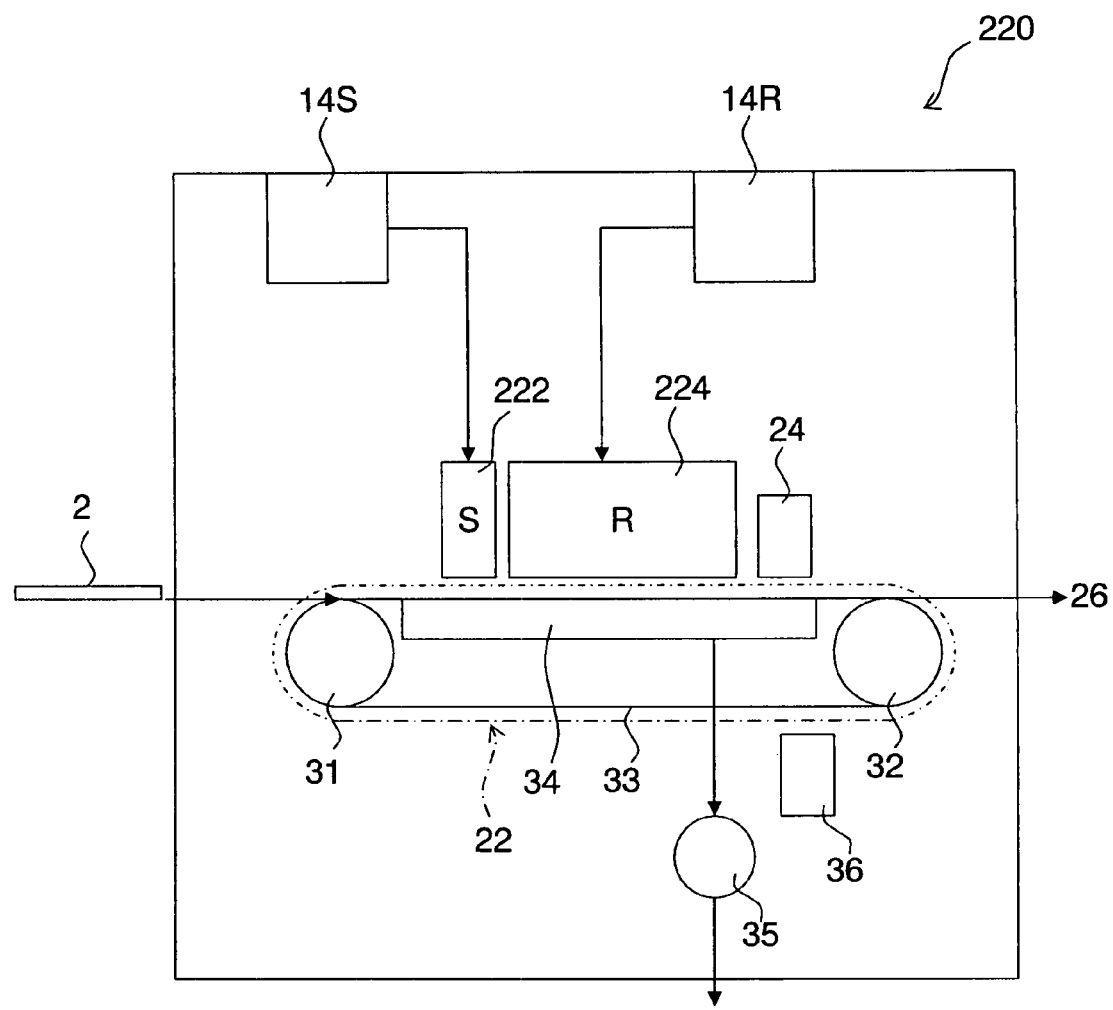
FIG. 16 is a general schematic drawing of a liquid-jet recording apparatus relating to a further modification example of the present invention.

FIG. 16 shows the general composition of a two-liquid type of liquid-jet recording apparatus 200 which cures resist liquid by using a treatment liquid.

The liquid-jet recording apparatus 220 shown in FIG. 16 comprises: a treatment liquid deposition unit 222 which deposits, onto the substrate 2, a treatment liquid that cures the resist liquid if making contact with the resist liquid; and a resist liquid head 224, provided on the downstream side of the treatment liquid deposition unit 222 in terms of the substrate conveyance direction, which ejects resist liquid that is cured if reacting with the treatment liquid. Furthermore, the treatment liquid is supplied to the treatment liquid deposition unit 222 from a treatment liquid storing and loading unit 14S, via a supply channel (not illustrated). The treatment liquid storing and loading unit 14S has the same composition as the ink storing and loading unit 14R (the resist liquid storing and loading unit 14 shown in FIG. 2) which supplies the resist liquid to the resist liquid head 224.

When resist liquid is ejected onto the substrate 2 on which treatment liquid has been deposited, the resin particles in the resist liquid aggregate due to the action of the treatment liquid, and the resist liquid (resin particles) become fixed on the substrate 2. Although not shown in FIG. 16, the solvent of the resist liquid remaining on the substrate 2 is removed by means of a solvent removal unit. The modes of removal of the solvent of the resist liquid include a mode in which the solvent is removes by means of contact between the solvent and an absorbing member such as an absorbing roller, and a mode in which the solvent is made to dry by using a heating device such as a heater.

For the treatment liquid deposition unit 222, it is possible to use an ejection head having the same structure as the resist liquid head 224, and it is also possible to use a mode which deposits treatment liquid onto the substrate 2 by means of an application member, such as a roller. In other words, it is possible to deposit the treatment liquid only onto the dot formation positions of the resist liquid, and it is also possible to deposit the treatment liquid onto a broader range than the resist liquid dot formation positions.

In the two-liquid type of liquid-jet recording apparatus 220 shown in FIG. 16, the heating fan 41 for pre-heating the substrate 2 shown in FIG. 2, and the heating device given as one example of a curing process unit 23, are not necessary.

The treatment liquid deposition unit 222 is controlled via the treatment liquid deposition control unit in accordance with a control signal sent by the ejection control unit (see FIG. 7). For example, in a mode where treatment liquid is deposited onto the ejection positions of the resist liquid, by means of an ejection head, then the ejection of the treatment liquid ejection head is controlled on the basis of treatment liquid ejection data which is identical to the resist liquid ejection data generated from the resist pattern data.

FIG. 16 shows a mode where the treatment liquid deposition unit 222 and the resist liquid head 224 are provided independently, but in a mode where an ejection head is used for the treatment liquid deposition unit 222, it is also possible to form the treatment liquid deposition unit 222 (the treatment liquid head) and the resist liquid head 224 in an integrated fashion.

In a mode where the resist liquid is cured due to reacting together two liquids, it is possible to cure and fix the resist liquid onto the substrate 2, without providing a curing process unit 23 such as that shown in FIG. 2.

Apart from the mode shown in FIG. 16, it is also possible to adopt a mode in which a resist pattern is formed on a substrate 2 by means of a resist liquid having a radiation-curing function, and the resist liquid is then cured by radiating radiation onto the resist pattern. In other words, the resist liquid includes a polymerization initiator and a radiation-curable polymerizable compound, such as a radiation-curable monomer (or radiation-curable oligomer), and a radiation source is used for the curing process unit 23 shown in FIG. 6. It is possible to use ultraviolet light or an electron beam, or the like, as the radiation, and an ultraviolet light source, an infrared light source, an electron beam irradiation mechanism, or the like, which provides a supply of the radiation to be radiated is used as a radiation source.

If a mode which cures the resist liquid by radiating radiation is used in the second embodiment, then a desirable mode for the composition of the head is one in which a plurality of head blocks each having one nozzle row are arranged in the sub-scanning direction, as shown in FIG. 9B. Moreover, it is also desirable to adopt a mode in which a radiation source is provided on the downstream side of each head block, in such a manner that the resist liquid ejected from each head block is cured by radiating radiation onto the resist liquid by means of the individual radiation source, whereupon resist liquid is ejected from the subsequent head block.

Furthermore, although not shown in the drawings, it is also possible to cure the ejection resist liquid by drying, during flight. In other words, it is also possible to adopt a mode in which the atmosphere through which the resist liquid is propelled is a drying atmosphere. Further possible modes include: one which uses a resist liquid having thermoplastic properties or a resist liquid having phase changing properties (for example, a resist liquid having the same properties as solid ink), whereby the resist liquid which is heated by a heating device for heating the head to change the phase is ejected, and the resist liquid deposited on the substrate 2 is then cooled and cured by a cooling device; and a mode in which, a resist liquid having ER (electrorheological properties) is used, an electric field application device which applies an electric field to the resist liquid on the substrate 2 is provided, and the resist liquid on the substrate 2 is cured by using the electrorheological effect.

Application Example

Figure 17A:
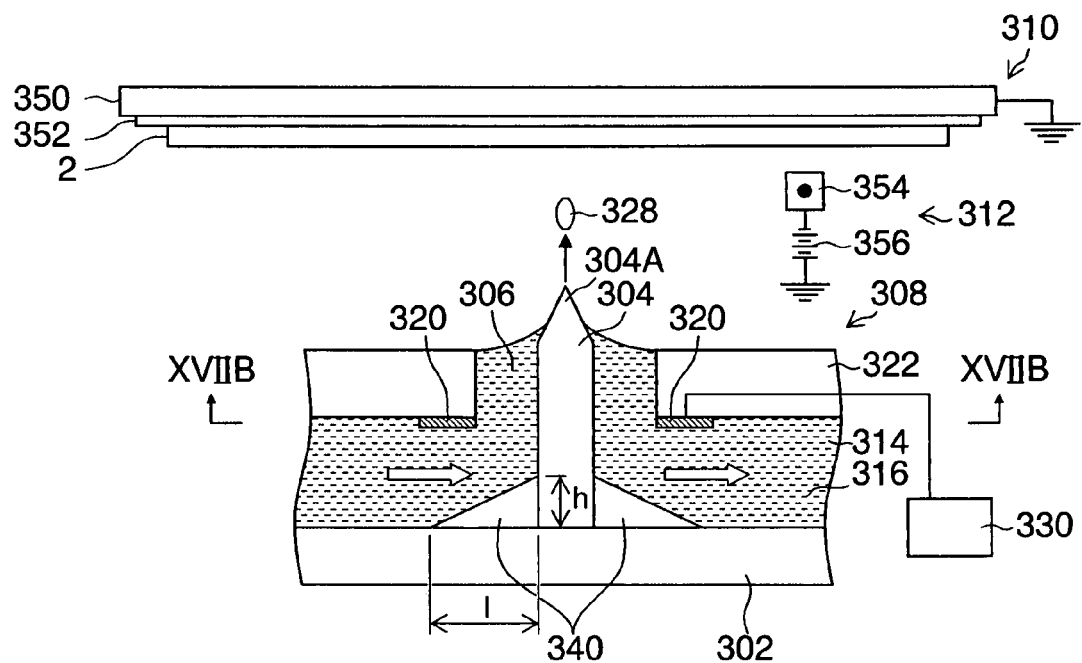
FIGS. 17A and 17B are general schematic drawings of a liquid-jet recording apparatus relating to an application example of the present invention.
Figure 17B:
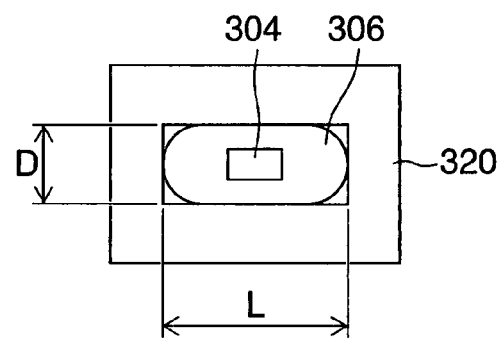

Next, an application example of an embodiment of the present invention is described below. FIGS. 17A and 17B are a conceptual diagram for describing the composition of an electrostatic type of liquid-jet recording apparatus and a resist liquid ejection method. The electrostatic type of liquid-jet recording apparatus described below ejects resist liquid 316 that is condensed in the head 300, and therefore it is possible effectively to prevent the landing interference on the substrate 2 without providing a composition which preliminarily cures the resist liquid 316 deposited on the substrate 2. Furthermore, since the resist liquid 316 is ejected by applying an electric field to the resist liquid 316 from a charging device (electric field application device), then it is possible to form dots of high definition and achieve excellent stable deposition accuracy. Consequently, this method is more suitable for forming a resist pattern on a printed wiring substrate where high definition and high accuracy are required.

FIG. 17A shows a schematic view of the cross-section of the general composition of a head 300 relating to an application example of the present invention, and FIG. 17B shows a cross-sectional diagram along line XVIIB-XVIIB in FIG. 17A. As shown in FIG. 17A, the head 300 comprises a head substrate 302, an ejection guide 304, and an ejection port substrate 308 formed with an ejection port 306. An ejection electrode 320 is disposed on the ejection port substrate 308 so as to surround the ejection port 306. An opposing electrode 310 which supports the substrate 2 and a charging unit for the substrate 2 are disposed in positions facing the ejection side surface of the head 300 (in FIGS. 17A and 17B, the upper surface).

Furthermore, the head substrate 302 and the ejection port substrate 308 are disposed so as to face each other at a prescribed interval apart. A resist liquid flow channel 314 which supplies ink to each ejection port 306 is formed by the space created between the head substrate 302 and the ejection port substrate 308.

The head 300 has a multi-channel structure in which a plurality of ejection ports (nozzles) 306 are arranged in a two-dimensional configuration, in order that image recording of higher density can be achieved at faster speeds. The plurality of ejection ports 306 are arranged two-dimensionally in the ejection port substrate 308 of the head 300, but in FIGS. 17A and 17B, only one ejection port of the plurality of ejection ports is depicted, in order to make understanding of the structure of the head 300 easier.

A resist liquid 316 comprising charged resin particles dispersed in an insulating liquid (carrier liquid) is used in the head 300. An electric field is generated at an ejection port 306 by applying a drive voltage to the corresponding ejection electrode 320 provided on the ejection port substrate 308, and the resist liquid in the ejection port 306 is ejected by means of a resulting electrostatic force. By switching the drive voltage applied to the ejection electrodes 320 on and off (ejection on and ejection off), in accordance with the resist pattern data, then resist liquid is ejected from the ejection ports 306 in accordance with the resist pattern data and a resist pattern is formed accordingly on the substrate 2.

Below, the structure of the head 300 according to the present example shown in FIGS. 17A and 17B is described in more detail.

As shown in FIG. 17A, the ejection port substrate 308 of the head 300 comprises an insulating substrate 322 and provided with the ejection electrodes 320, and the ejection electrodes 320 which are supplied with a drive voltage for causing the ejection of resist liquid are formed on the lower surface of the insulating substrate 322 in terms of the drawing (namely, the side which faces toward the head substrate 302).

Furthermore, the ejection ports 306 for ejecting resist liquid droplets 328 are formed in the ejection port substrate 308 so as to pass through the insulating substrate 322. As shown in FIG. 17B, the ejection ports 306 are cocoon-shaped openings (slits) which extend in the flow direction of the resist liquid, the shorter edges at either end of the rectangular shape being formed in a semi-circular shape. The aspect ratio (L/D) between the length L thereof in the flow direction of the resist liquid and the length D in the direction perpendicular to the flow of resist liquid is equal to or greater than 1.

In the present embodiment, in this way, by forming the ejection ports 306 to be openings having an aspect ratio (L/D) equal to or greater than 1 between the length L in the flow direction of the resist liquid and the length D in the direction perpendicular to the flow of the resist liquid, the resist liquid is made to flow readily to the ejection ports 306. In other words, it is possible to improve the supply of the particles of resist liquid to the ejection ports 306, and therefore the frequency response is improved and blockages can be prevented. This point is described in more detail hereinafter, together with the action of ejecting resist liquid droplets.

In the present embodiment, the ejection ports 306 are formed as cocoon-shaped openings, but they are not limited to this shape, and the ejection ports 306 may be formed to any shape which allows the resist liquid to be ejected from the ejection ports 306, such as a circular shape, a substantially circular shape, an elliptical shape, a rectangular shape, a square shape, a rhomboid shape, a parallelogram shape, or the like.

Desirably, the ejection ports 306 have a shape which is elongated in the flow direction of the resist liquid, in such a manner that the aspect ratio between the length in the flow direction of the resist liquid and the length in the direction perpendicular to the flow of the resist liquid is equal to or greater than 1. Consequently, the supply of the resist liquid to the ejection ports is improved, blockages can be prevented, large dots can be formed continuously, in a stable fashion, on the substrate 2, and a high-quality resist pattern can be recorded at a higher recording frequency. For example, it is possible to form ejection ports in a rectangular shape having longer edges in the flow direction of the resist liquid, or in an elliptical or rhomboid shape having a longer size in the flow direction of the resist liquid. Furthermore, it is also possible to form ejection ports in a trapezoid shape in which the upstream side in terms of the flow of resist liquid is taken as the upper base, the downstream side is taken as the lower base, and the height in the direction of flow of the resist liquid is greater than the length of the lower base. In this case, it is also possible to make the edge on the upstream side longer, or to make the edge on the downstream side longer. Moreover, it is also possible to adopt a shape comprising a rectangular shape having longer edges in the flow direction of the resist liquid, with large circles having a diameter larger than the shorter edges of the rectangular shape being attached to both of the shorter edges of the rectangular shape. By forming the ejection ports 306 to have an elongated shape in the flow direction of the resist liquid in this way, it is possible to improve the supply of resist liquid to the ejection ports 306, as well as being able to prevent blockages. Furthermore, the ejection ports 306 may be symmetrical or asymmetrical on the upstream side and the downstream side of their center.

Next, the ejection electrodes 320 formed on the ejection port substrate 308 of the head 300 shown in FIG. 17A are described below. Ejection electrodes 320 such as that shown in FIG. 17B are formed on the lower surface of the insulating substrate 322 (the surface facing the head substrate 302). The ejection electrodes 320 are disposed respectively about the perimeter edge of the ejection ports 306 so as to surround the perimeter of the ejection ports 306. In FIG. 17B, the ejection electrode 320 is formed in a similar shape to the ejection port 306, but it is not limited to this, and may also be changed to various other shapes, provided that it surrounds the perimeter of the ejection port 306. For example, it is possible to form the ejection electrode with a circular, substantially circular, elliptical or substantially elliptical shape, or the like. Moreover, it is possible to change the shape variously, according to the shape of the ejection port 306. The ejection electrode 320 does not have to surround the perimeter of the ejection port 306 completely, and it may, for example, be formed in a C shape or a square U shape, in which a portion of the ejection electrode is removed on the upstream side or the downstream side in terms of the direction of flow of the resist liquid. Moreover, it is also possible to adopt parallel electrodes or substantially parallel electrodes which are disposed on either side of the ejection port (across the ejection port), in parallel with the flow direction of the resist liquid.

As stated previously, the head 300 has a multi-channel structure in which ejection ports 306 are arranged two-dimensionally (see FIG. 3), and therefore, the ejection electrodes 320 are also arranged in a two-dimensional configuration so as to correspond with the respective ejection ports 306.

Furthermore, the ejection electrodes 320 are exposed to the resist liquid flow channel 314 and make contact with the resist liquid 316 flowing in the resist liquid flow channel 314. By adopting a structure of this kind, the head 300 shown in FIG. 17A is able significantly to improve the resist liquid ejection characteristics. This point is described in detail below together with the ejection action. However, the ejection electrodes 320 do not necessarily have to be exposed to the resist liquid flow channel 314 and make contact with the resist liquid, and the ejection electrodes 320 may be formed inside the ejection substrate 308, or the surface of the ejection electrode 320 shown in FIG. 17A which is exposed to the resist liquid flow channel 314 may be covered with an insulating layer.

Furthermore, the ejection electrodes 320 are connected to a drive voltage control unit 330, as shown in FIG. 17A. The drive voltage control unit 330 is able to control the drive voltage applied to the ejection electrodes, when ejecting resist liquid and when not ejecting resist liquid, in accordance with the recording signal (the resist pattern data).

Next, the ejection guide 304 of the head 300 shown in FIG. 17A is described below. The ejection guides 304 are made of a ceramic flat plate having a prescribed thickness and are disposed on the head substrate 302 so as to correspond to the respective ejection ports 306 (ejection sections). The ejection guides 304 are each formed to have a slightly broadened shape in accordance with the length of the ejection ports 306 in the direction of the longer dimension. As stated previously, the ejection guides 304 pass through the respective ejection ports 306 and the front end portion 304A of each ejection guide 304 projects above the surface of the ejection port substrate 308 on the side adjacent to the substrate 2 (the front surface of the insulating substrate 322).

The front end section 304A of the ejection guide 304 is formed in a substantially triangular shape (or a trapezoid shape) in such a manner that the cross-sectional shape parallel to the direction of flow of the resist liquid gradually narrows toward the side of the opposing electrode 310. The ejection guide 304 is disposed in such a manner that inclined surfaces of the front end portion 304A intersect with the direction of flow of the resist liquid. By this means, the resist liquid flowing into the ejection port 306 passes along the inclined surfaces of the front end portion 304A of the ejection guide 304 until reaching the apex of the front end portion 304A, and therefore the resist liquid forms a stable meniscus in the ejection port 306.

Furthermore, by forming the ejection guide 304 to be broadened in the lengthwise direction of the ejection port 306, it is possible to shorten the width thereof in the direction perpendicular to the flow of resist liquid, and therefore the influence of the ejection guide 304 on the flow of resist liquid can be reduced while a stable meniscus can be formed as described below.

The shape of the ejection guide 304 can be changed suitably, provided that it enables the resin particles in the resist liquid 316 to be condensed at the front end portion 304A by passing through the ejection port 306 in the ejection port substrate 308, and there are no particular restrictions on the shape of the ejection guide 304; for instance, the ejection guide 304 may be shaped in such a manner that the front end portion 304A narrows gradually towards the side of the opposing electrode 310. For example, it is also possible to form, in the central portion of the ejection guide 304, a cutaway section forming a guide groove which gathers the resist liquid 316 to the front end portion 304A by means of a capillary action acting in the vertical direction in the drawing. Furthermore, in FIG. 17B, the ejection guide 304 has a plate shape having a longer dimension in the direction of flow of the resist liquid, but the shape is not limited to this and it may also be a square rod shape.

Moreover, it is desirable that metal should be deposited by vapor deposition onto the endmost tip portion of the ejection guide 304, because by depositing metal onto this endmost tip, the dielectric constant of the front end portion 304A of the ejection guide 304 is raised substantially. By this means, a strong electric field can be created readily in the ejection guide 304 when a drive voltage is applied to the ejection electrode, and therefore the resist liquid ejection characteristics can be improved.

As shown in FIG. 17A, a desirable mode of the head 300 according to the present embodiment is one in which guide dams 340 for guiding the resist liquid to the ejection port 306 are provided on the head substrate 302. The guide dams 340 are provided on the surface of the head substrate 302 on the side adjacent to the resist liquid flow channel 314, in other words, on the bottom face of the resist liquid flow channel 314, on the upstream side and the downstream side of the ejection guide 304 in terms of the direction of flow of the resist liquid. The guide dams 340 have surfaces which are inclined with respect to the direction of flow of the resist liquid, in such a manner that they gradually approach the ejection port substrate 308, from the vicinity of the position corresponding to the ejection port 306, toward a position corresponding to the center of the ejection port 306. In other words, the guide dams 340 have a shape which is inclined toward the ejection port 306 in the direction of flow of the resist liquid.

Furthermore, the guide dams 340 have substantially the same width as the ejection ports 306 in terms of the direction perpendicular to the flow of the resist liquid, and have walls which rise up vertically from the bottom surface. Moreover, the guide dams 340 are provided at a prescribed interval from the surface of the ejection port substrate 308 on the side adjacent to the resist liquid flow channel 314, in other words, from the upper surface of the resist liquid flow channel 314, in such a manner that the flow channel of the resist liquid 316 is preserved and the ejection port 306 is not sealed off. These guide dams 340 are provided for each of the ejection ports.

In this way, by providing guide dams 340 which are inclined toward the ejection port 306 in the flow direction of the resist liquid, on the bottom face of the resist liquid flow channel 314, a flow of the resist liquid toward the ejection port 306 is created, and the resist liquid 316 is guided toward the opening of the ejection port 306 on the side adjacent to the resist liquid flow channel 314. Therefore, it is possible to make the resist liquid 316 flow appropriately inside the ejection port 306, and the supply of the resin particles of the resist liquid can be improved further. Moreover, it is also possible to prevent blockages of the ejection ports more reliably.

The length l of each guide dam 340 in the liquid flow direction should be set appropriately in such a manner that the resist liquid 316 can be guided suitably to the ejection port 306, without interfering with adjacently positioned ejection ports; desirably, the length l of each guide dam 340 is 3 or more times, and more desirably, 8 or more times, the height h of the highest portion of the guide dam 340 (in other words, desirably, $l/h \geqq 3$, and more desirably, $l/h \geqq 8$).

Desirably, the width of the guide dams 340 in the direction perpendicular to the flow of resist liquid is the same as or slightly greater than the ejection ports 306. Furthermore, the width of the guide dams 340 is not limited to being a uniform width as in the drawing, and the guide dams 340 may also decrease gradually in width or increase gradually in width, or the like. Moreover, the wall surfaces of the guide dams 340 are not limited to being vertical surfaces, and they may also be inclined surfaces, or the like.

The inclined surfaces of the guide dams 340 (the surfaces which guide the resist liquid) should be formed to a suitable shape for guiding the resist liquid 316 toward the ejection port 306, and they may be inclined surfaces having a uniform angle of inclination, or they may be surfaces having a variable angle of inclination, or curved surfaces. Furthermore, a surface of the guide dams 340 is not limited to being a smooth surface, and it is also possible to form one or more ridge or groove, or the like, in the direction of ink flow, or in a radiating fashion toward the center of the ejection port 306.

Furthermore, the vicinity of the contact sections between the ejection guide 304 and the upper portions of the guide dams 340 may be formed to have a smoothly connected shape, rather than having a step difference as shown in the drawing.

In the example shown in the drawing, guide dams 340 are disposed on the upstream side and the downstream side of the ejection guide 304, but it is also possible to adopt a mode in which a trapezoid-shaped guide dam 340 having an inclined surface on the upstream side and the downstream side of the ejection port 306 is provided, the ejection guide 304 being erected on top of this guide dam 340, and it is also possible to form the ejection guide 304 and the guide dam 340 in an integrated fashion. In this way, the guide dam 340 may be formed separately from the ejection guide 304, may be formed integrally with the ejection guide 304, may be formed on the head substrate 302, and may be formed by cutting away the head substrate 302 by means of a commonly known excavation technique.

A guide dam 340 should be provided on the upstream side of the ejection port 306, but as shown in FIGS. 17A and 17B, it is desirable to provide a guide dam 340 on the downstream side of the ejection port 306 as well, in such a manner that the height in the ejection direction of the resist liquid droplet 328 reduces gradually as the position moves away from the ejection port 306. Consequently, since the resist liquid 316 guided toward to the ejection port 306 by the guide dam 340 on the upstream side flows smoothly to the downstream side, then there is no turbulence in the flow of the resist liquid 316, and it is possible to maintain a stable flow of resist liquid, and to maintain stable ejection.

Next, the opposing electrode 310 which is disposed facing the ejection surface of the head 300 for the resist liquid droplets 328 is described below. As shown in FIG. 17A, the opposing electrode 310 is disposed at a position facing the front end portion 304A of the ejection guide 304, and it comprises an electrode substrate 350 which is earthed, and an insulating sheet 352 disposed on the lower surface of the electrode substrate 350 in terms of the drawing, in other words, on the surface of the electrode substrate 350 adjacent to the head is 300.

A substrate 2 is held on the lower surface of the opposing electrode 310 in terms of the drawing, in other words, on the surface of the insulating sheet 352, by means of electrostatic attraction, for example. The opposing electrode 310 (insulating sheet 352) functions as a platen for the substrate 2.

During recording, at least, the substrate 2 held on the insulating sheet 352 of the opposing electrode 310 is charged to a prescribed high negative voltage, which is of opposite polarity to the drive voltage applied to the ejection electrode 320, by means of the charging unit 312. Consequently, the substrate 2 becomes negatively charged and is biased to a high negative voltage, and effectively, it acts as an opposing electrode with respect to the ejection electrode 320, as well as being electrostatically attracted to the insulating sheet 352 of the opposing electrode 310.

The charging unit 312 comprises a scorotron charger 354 for charging the substrate 2 to a high negative voltage, and a bias voltage source 356 which supplies a high negative voltage to the scorotron charger 354. The charging device of the charging unit 312 used in the present embodiment is not limited to being a scorotron charger 354, and it is also possible to use various types of charging devices, such as a corotron charger, a solid state charger, a discharge pin, or the like.

Furthermore, in the example illustrated, the opposing electrode 310 is constituted by an electrode substrate 350 and an insulating sheet 352, and the substrate 2 is charged to a high negative voltage by means of the charging unit 312, thereby applying a bias voltage and causing the substrate 2 to act as an opposing electrode, while attracting the substrate 2 electrostatically to the surface of the insulating sheet 352; however, the present invention is not limited to this, and it is also possible to compose the opposing electrode 310 from an electrode substrate 350 only, and to connect the opposing electrode 310 (the electrode substrate 350 itself) to a bias voltage source having a high negative voltage, thereby setting the electrode substrate 350 to a permanent high negative voltage bias, in such a manner that the substrate 2 is electrostatically attracted to the surface of the opposing electrode 310.

Furthermore, it is also possible to create electrostatic attraction of the substrate 2 to the opposing electrode 310, and to charge the substrate 2 to a high negative voltage or to apply a high negative bias voltage to the opposing electrode 310, by means of separate high negative voltage sources, and furthermore, the mechanism for holding the substrate 2 on the opposing electrode 310 is not limited to electrostatic attraction of the substrate 2, and it is also possible to use another holding method or holding device.

The structure of the head 300 according to the present embodiment is described above in detail. Next, the operation of ejecting resist liquid from a head having a structure of this kind is described below.

When the head 300 is performing a recording operation, drive voltages are applied to the ejection electrodes 320. The drive voltages are applied in order to eject resist liquid in synchronism with a printing signal (resist pattern data). When a print signal indicating ejection of resist liquid is supplied to the drive voltage control unit 330 connected to an ejection electrode 320, then a drive voltage is applied to the ejection electrode 320 at the same timing as the print signal. By this means, an electric field which acts on ink ejection is generated from the ejection electrode 320 and ink is ejected from the ejection port 306.

On the other hand, if a print signal indicating non-ejection of resist liquid is supplied to the drive voltage control unit, then no drive voltage is applied to the ejection electrode 320 so that the ejection electrode 320 assumes a voltage of 0V. Therefore, an electric field for ejection is not generated from the ejection electrode 320, and ink is not ejected from the ejection port 306. One cycle of the print signal corresponds to the time required to form one dot on the substrate 2. Furthermore, the drive voltage applied to the ejection electrode 320 is set to 600V, for example. If a drive voltage is not applied to the ejection electrode 320, then the ejection electrode 320 is set to 0V for example. The voltage value of the drive voltage is not limited to the values given above, and it can be set to any desired voltage value, provided that ink can be ejected reliably when a drive voltage is applied to the ejection electrode 320.

Next, the resist liquid used in the head 300 according to the present application example is described below.

The resist liquid 316 is obtained by dispersing resin particles in a carrier liquid. Desirably, the carrier liquid is a dielectric liquid (non-aqueous solution) having a high electrical resistance (of $10^9$ Ω·cm or above, and more desirably, $10^{10}$ Ω·cm or above). If the electrical resistance of the carrier liquid is low, then the carrier liquid itself receives the injection of charge and becomes charged, due to the drive voltage applied to the control electrode, and therefore concentration of the resin particles does not occur. Furthermore, a carrier liquid having a low electrical resistance is not suitable since there are concerns that electrical conduction may occur between mutually adjacent control electrodes.

The dielectric constant (relative dielectric constant) of the dielectric liquid used as the carrier liquid is desirably 5 or lower, and more desirably, 4 or lower, and even more desirably, 3.5 or lower. By adopting a range of this kind for the dielectric constant, an electric field acts efficiently on the resin particles in the carrier liquid and the migration is more liable to occur.

The upper limit of the intrinsic electrical resistance of the carrier liquid of this kind is desirably around $10^{16}$ Ω·cm, and the lower limit of the dielectric constant is desirably around 1.9. The reason why it is desirable for the electrical resistance of the carrier liquid to be in the range described above is because the ejection of resist liquid at low electric field intensity becomes poorer, as the electrical resistance becomes lower. Furthermore, the reason why it is desirable for the dielectric constant to be in the range described above is because the electric field is attenuated by polarization of the solvent as the dielectric constant becomes higher, and this can cause bleeding of the formed dots.

The dielectric liquid used as the carrier liquid is desirably a straight chain or branched aliphatic hydrocarbon, an alicyclic hydrocarbon, or an aromatic hydrocarbon, or a halogen substitute of these hydrocarbons. For example, it is possible to use, individually or in mixed fashion: hexane, heptane, octane, isooctane, decane, isodecane, decalin, nonane, dodecane, isododecane, cyclohexane, cyclooctance, cyclodecane, benzene, toluene, xylene, mesitylene, Isopar C, Isopar E, Isopar G, Isopar H, Isopar L, Isopar M (Isopar: product name of Exxon Mobil Corp.), Shellsol 70, Shellsol 71 (Shellsol: product name of Shell Oil Co.), Amsco OMS, Amsco 460 solvent (Amsco: product name of American Mineral Spirits Co.), silicone oil (for example, KF-96L manufactured by Shin-Etsu Silicone Co., Ltd./Shin-Etsu Chemical Co., Ltd.), and the like.

The resin particles which are dispersed in the carrier liquid of this kind may be simply be resin particles that are dispersed directly in the carrier liquid, but desirably, dispersive resin particles are included in order to improve the fixing properties.

Moreover, the dispersive resin particles may be, for example, rosin particles, a rosin-modified phenol resin, an alkyd resin, a (meth)acrylic polymer, polyurethane, polyester, polyamide, polyethylene, polybutadiene, polystyrene, polyacetic vinyl, an acetal modification of a polyvinyl alcohol, polycarbonate, or the like.

Of these, from the viewpoint of the ease of forming particles, a desirable polymer is one having a weight-average molecular weight of 2,000 to 1,000,000 and a polydispersion degree (weight-average molecular weight/number-average molecular weight) in the range of 1.0 to 5.0. Moreover, from the viewpoint of the ease of fixing, it is desirable to use a polymer having at least one of the softening point, the glass transition point and the melting point in the range of 40° C. to 120° C.

In the resist liquid 316, the content of resin particles (the total weight content of resin particles or resin particles and dispersive resin particles) is desirably in the range of 0.5 to 30 wt % (weight percent) with respect to the total amount of resist liquid, and more desirably, it is in the range of 1.5 to 25 wt %, and even more desirably, in the range of 3 to 20 wt %. If the content of resin particles is low, then problems are liable to occur, such as insufficient density in the printed image, difficulties in achieving affinity between the resist liquid 316 and the surface of the substrate 2, and failure to obtain a durable image, whereas if the content of resin particles is too high, then other problems are liable to occur, such as difficulties in obtaining a uniform dispersion solution, increased liability to blockages of resist liquid 316 in the head, and difficulties in achieving stable ink ejection.

Furthermore, desirably, the average particle size of the resin particles dispersed in the carrier liquid is 0.1 to 5 μm, and more desirably, it is 0.2 to 1.5 μm, and even more desirably, 0.4 to 1.0 μm. This particle size was determined by means of a CAPA-500 instrument (product name, manufactured by HORIBA, Ltd.).

After dispersing the resin particles in the carrier liquid (a dispersant may also be used, if necessary), the resin particles are charged by adding a charge control agent to the carrier liquid, thereby forming a resist liquid 316 in which the charged resin particles are dispersed in the carrier liquid. When dispersing the resin particles, it is possible to add a dispersant, if necessary.

For the charge control agent, for example, it is possible to use various agents which are employed in electrophotographic developing solutions. Furthermore, it is also possible to use various charge control agents described, for instance, in: "Recent development and application of electrophotographic developing systems and toner materials", pp. 139 to 148; "Electrophotographic technology: Fundamentals and applications", edited by Society of Electrophotography of Japan, pp. 497 to 505, (Corona, 1988); or "Electrophotography" 16 (No. 2), p. 44 (1977), by Yuji Harazaki.

The resin particles can be charged to have a positive charge or a negative charge, provided that the charge is of the same polarity as the drive voltage that is to be applied to the control electrode.

The amount of charge of the resin particles is desirably in the range of 5 to 200 μC/g, more desirably, 10 to 150 μC/g, and even more desirably, 15 to 100 μC/g.

Furthermore, the electrical resistance of the dielectric solvent may also change with the addition of the charge control agent, and therefore the distribution ratio P defined below is desirably not less than 50%, and more desirably, not less than 60%, and even more desirably, not less than 70%.

$$P=100\times(\sigma 1-\sigma 2)/\sigma 1$$

Here, σ1 is the electrical conductivity of the resist liquid 316, and σ2 is the electrical conductivity of the skimmed portion when the resist liquid 316 is placed in a centrifuge apparatus. The electrical conductivity was the value measured by using an LCR meter (AG-4311 manufactured by Ando Electric Co., Ltd.) and an electrode for liquid (LP-05 manufactured by Kawaguchi Electric Works Co., Ltd.), under conditions of 5V applied voltage and 1 kHz frequency. Furthermore, centrifugal separation was carried out using a compact high-speed refrigerated centrifuge apparatus (SRX-201 manufactured by Tomy Seiko Co., Ltd.), for 30 minutes at a rotational speed of 14500 rpm and a temperature of 23° C.

By using a resist liquid 316 such as that described above, migration of the charged particles becomes more liable to occur and the particles can be concentrated more readily.

The electrical conductivity of the resist liquid 316 is desirably 100 to 3000 pS/cm, more desirably, 150 to 2500 pS/cm, and even more desirably, 200 to 2000 pS/cm. By setting the electrical conductivity to the range described above, the voltage applied to the control electrode does not become excessively high, and there are no concerns regarding the occurrence of electrical conduction between mutually adjacent recording electrodes.

Furthermore, the surface tension of the resist liquid 316 is desirably in the range of 15 to 50 mN/m, and more desirably, 15.5 to 45 mN/m, and even more desirably, 16 to 40 mN/m. By setting the surface tension to this range, the voltage applied to the control electrode does not become excessively high, and there is no spreading and leaking of ink about the periphery of the head.

Moreover, the viscosity of the resist liquid 316 is desirably 0.5 to 5 mPa·sec, more desirably, 0.6 to 3.0 mPa·sec, and even more desirably 0.7 to 2.0 mPa·sec.

A resist liquid 316 of this kind can be manufactured, for example, by dispersing resin particles in a carrier liquid, and then adding a charge adjusting agent to the dispersion medium in order to create a charge on the resin particles. Examples of the specific manufacturing method are given below.

(1) Resin particles, or resin particles and dispersive resin particles, are mixed (kneaded) in advance and then dispersed in a carrier liquid, using a dispersant if necessary, and a charge adjusting agent is added.

(2) Resin particles, or resin particles and dispersive resin particles, and a dispersant are added simultaneously to a carrier liquid and dispersed therein, and a charge adjusting agent is added.

(3) Resin particles and a charge adjusting agent (if necessary, dispersive resin particles and a dispersant), are added simultaneously to a carrier liquid and dispersed therein.

As described above, in the head 300 according to the present application example, it is possible to eject resist liquid which is concentrated in the head, without providing a separate device for increasing the viscosity of the resist liquid to be deposited on the substrate 2, and it is possible effectively to prevent landing interference of the resist liquid on the substrate 2. Moreover, features such as high definition and high deposition accuracy are also achieved, and therefore the present embodiment is suitable for forming a resist pattern.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A liquid ejection apparatus, comprising:
a head having a plurality of nozzle groups, each of the plurality of nozzle groups including a plurality of nozzles which are aligned in a first direction and performs ejection of resist liquid onto a wiring substrate;
a scanning device which causes the head and the wiring substrate to move relatively in the first direction;
an ejection control device which controls the ejection of the resist liquid from the head; and
a scanning control device which controls the scanning device in such a manner that the head and the wiring substrate are relatively moved only once in the first direction, through a region of the wiring substrate which corresponds to one relative movement in the first direction of the wiring substrate and the scanning device, wherein:
the ejection control device is configured to control the ejection of the resist liquid from the head to cause the resist liquid to be ejected onto a same position of the wiring substrate sequentially, at prescribed time intervals, from different nozzles of one of the plurality of nozzle groups, to deposit the resist liquid ejected onto the same position of the wiring substrate sequentially from the different nozzles of the one of the plurality of nozzle groups, in such a manner that a resist pattern having a prescribed thickness and a prescribed pattern is formed on the wiring substrate;

the plurality of nozzle groups are arranged in a second direction which is perpendicular to the first direction, at arrangement intervals which are equal to a minimum interval in the second direction between dots of the resist pattern on the wiring substrate; and a diameter of dot of the resist liquid ejected initially onto the same position of the wiring substrate from each of the plurality of nozzle groups is less than a distance between centers of dots of the resist liquid which are mutually adjacent in the second direction on the wiring substrate.

2. The liquid ejection apparatus as defined in claim 1, wherein each of the nozzle groups includes the plurality of nozzles which are aligned in the first direction and of which number is not less than maximum number of the ejection of the resist liquid from the head with respect to the same position of the wiring substrate.

3. The liquid ejection apparatus as defined in claim 1, further comprising a curing device which cures the resist liquid on the wiring substrate.

4. The liquid ejection apparatus as defined in claim 1, further comprising an electric field creation device which generates an electric field between the head and the wiring substrate, wherein:

the resist liquid contains an insulating solvent, a polymerizable compound, a dispersant and a charge adjusting agent in such a manner that charged particles are dispersed in the insulating solvent; and the electric field creation device applies the electric field to the resist liquid in such a manner that the charged particles are made to adhere to the wiring substrate.

5. The liquid ejection apparatus as defined in claim 1, wherein in each of the plurality of nozzle groups, one of the plurality of nozzles from which the resist liquid is ejected initially onto the same position of the wiring substrate has a diameter smaller than a diameter of another of the plurality of nozzles.

6. The liquid ejection apparatus as defined in claim 1, wherein with respect to each of the plurality of nozzle groups, the ejection control device alters drive voltage applied to an ejection element corresponding to one of the plurality of nozzles from which the resist liquid is ejected initially onto the same position of the wiring substrate so as to make volume of the resist liquid ejected from the one of the plurality of nozzles less than volume of the resist liquid ejected from another of the plurality of nozzles.

7. The liquid ejection apparatus as defined in claim 1, wherein the prescribed time intervals are not shorter than a time interval by which the resist liquid initially deposited on the wiring substrate acquires a semi-cured state.

8. A liquid ejection apparatus, comprising:

a head having a nozzle group including a plurality of nozzles which are aligned in a first direction and performs ejection of resist liquid onto a wiring substrate;

a scanning device which causes the head and the wiring substrate to move relatively in the first direction;

an ejection control device which controls the ejection of the resist liquid from the head; and a scanning control device which controls the scanning device in such a manner that the head and the wiring substrate are relatively moved only once in the first direction, through a region of the wiring substrate which corresponds to one relative movement in the first direction of the wiring substrate and the scanning device, wherein:

the ejection control device is configured to control the ejection of the resist liquid from the head to cause the resist liquid to be ejected onto a same position of the wiring substrate sequentially, at prescribed time intervals, from different nozzles of the nozzle group, to deposit the resist liquid ejected onto the same position of the wiring substrate sequentially from the different nozzles of the nozzle group, in such a manner that a resist pattern having a prescribed thickness and a prescribed pattern is formed on the wiring substrate; and a diameter of dot of the resist liquid ejected initially onto the same position of the wiring substrate from one of the plurality of nozzles aligned in the first direction is less than a distance between centers of dots of the resist liquid which are mutually adjacent in the first direction on the wiring substrate.

9. The liquid ejection apparatus as defined in claim 8, wherein the head has the nozzle group including the plurality of nozzles which are aligned in the first direction and of which number is not less than maximum number of the ejection of the resist liquid from the head with respect to the same position of the wiring substrate.

10. The liquid ejection apparatus as defined in claim 8, further comprising a curing device which cures the resist liquid on the wiring substrate.

11. The liquid ejection apparatus as defined in claim 8, further comprising an electric field creation device which generates an electric field between the head and the wiring substrate, wherein:

the resist liquid contains an insulating solvent, a polymerizable compound, a dispersant and a charge adjusting agent in such a manner that charged particles are dispersed in the insulating solvent; and the electric field creation device applies the electric field to the resist liquid in such a manner that the charged particles are made to adhere to the wiring substrate.

12. The liquid ejection apparatus as defined in claim 8, wherein with respect to the nozzle group, the ejection control device alters drive voltage applied to an ejection element corresponding to one of the plurality of nozzles from which the resist liquid is ejected initially onto the same position of the wiring substrate so as to make volume of the resist liquid ejected from the one of the plurality of nozzles less than volume of the resist liquid ejected from another of the plurality of nozzles.

13. The liquid ejection apparatus as defined in claim 8, wherein the prescribed time intervals are not shorter than a time interval by which the resist liquid initially deposited on the wiring substrate acquires a semi-cured state.

* * * * *